(12) United States Patent
Chia et al.

(10) Patent No.: US 12,200,940 B2
(45) Date of Patent: Jan. 14, 2025

(54) THREE-DIMENSIONAL MEMORY DEVICE

(71) Applicant: Taiwan Semiconductor Manufacturing Co., Ltd., Hsinchu (TW)

(72) Inventors: Han-Jong Chia, Hsinchu (TW); Chung-Te Lin, Tainan (TW); Feng-Cheng Yang, Zhudong Township (TW); Meng-Han Lin, Hsinchu (TW); Sheng-Chen Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/874,815

(22) Filed: Jul. 27, 2022

(65) Prior Publication Data

US 2022/0367516 A1   Nov. 17, 2022

Related U.S. Application Data

(62) Division of application No. 17/012,848, filed on Sep. 4, 2020, now Pat. No. 11,532,640.

(Continued)

(51) Int. Cl.
*H10B 51/20*   (2023.01)
*G11C 11/22*   (2006.01)
(Continued)

(52) U.S. Cl.
CPC .......... *H10B 51/20* (2023.02); *G11C 11/5657* (2013.01); *H01L 29/6684* (2013.01);
(Continued)

(58) Field of Classification Search
CPC .......... H01L 29/40111; H01L 29/6684; H01L 29/78391; H10B 51/10; H10B 51/20; H10B 51/30; G11C 11/2253; G11C 11/5657

See application file for complete search history.

(56) References Cited

U.S. PATENT DOCUMENTS 6,274,453 B1   8/2001   Schlosser et al.
8,349,681 B2   1/2013   Alsmeier et al.
(Continued)

FOREIGN PATENT DOCUMENTS

CN   103050149 A   4/2013
CN   103545279 A   1/2014
(Continued)

OTHER PUBLICATIONS

Claim recitation for U.S. Appl. No. 17/018,232, filed Sep. 11, 2020.
(Continued)

*Primary Examiner* — Herve-Louis Y Assouman
*Assistant Examiner* — Christopher M Roland
(74) *Attorney, Agent, or Firm* — Slater Matsil, LLP

(57) ABSTRACT

In an embodiment, a device includes: a first dielectric layer over a substrate; a word line over the first dielectric layer, the word line including a first main layer and a first glue layer, the first glue layer extending along a bottom surface, a top surface, and a first sidewall of the first main layer; a second dielectric layer over the word line; a first bit line extending through the second dielectric layer and the first dielectric layer; and a data storage strip disposed between the first bit line and the word line, the data storage strip extending along a second sidewall of the word line.

20 Claims, 42 Drawing Sheets

Related U.S. Application Data

(60) Provisional application No. 63/031,694, filed on May 29, 2020.

(51) Int. Cl.
    *G11C 11/56*     (2006.01)
    *H01L 29/66*     (2006.01)
    *H01L 29/78*     (2006.01)
    *H10B 51/10*     (2023.01)
    *H10B 51/30*     (2023.01)
    *H01L 21/28*     (2006.01)

(52) U.S. Cl.
    CPC .......... *H10B 51/30* (2023.02); *G11C 11/2253* (2013.01); *H01L 29/40111* (2019.08); *H01L 29/78391* (2014.09); *H10B 51/10* (2023.02)

(56) References Cited

U.S. PATENT DOCUMENTS

| | | | |
|---|---|---|---|
| 9,041,093 B2 | 5/2015 | Tanaka et al. | |
| 9,281,044 B2 | 3/2016 | Ramaswamy et al. | |
| 9,484,389 B2 | 11/2016 | Wouters et al. | |
| 9,496,274 B2 | 11/2016 | Pachamuthu et al. | |
| 9,570,464 B1 | 2/2017 | Wakatsuki et al. | |
| 9,620,513 B2 | 4/2017 | Lee et al. | |
| 9,620,712 B2 | 4/2017 | Hayashi et al. | |
| 9,748,257 B2 | 8/2017 | Lee et al. | |
| 9,947,721 B2 | 4/2018 | Fantini | |
| 9,953,992 B1 | 4/2018 | Ogawa et al. | |
| 10,056,150 B2 | 8/2018 | Ikeda et al. | |
| 10,109,639 B1 | 10/2018 | DeForge et al. | |
| 10,115,681 B1 | 10/2018 | Ariyoshi | |
| 10,256,248 B2 | 4/2019 | Lu et al. | |
| 10,283,513 B1 | 5/2019 | Zhou et al. | |
| 10,446,437 B2 | 10/2019 | Yang | |
| 10,593,399 B2 | 3/2020 | Fratin et al. | |
| 10,629,809 B2 | 4/2020 | Yamakawa | |
| 10,930,333 B2 | 2/2021 | Chen et al. | |
| 11,011,529 B2 | 5/2021 | Ramaswamy | |
| 11,081,524 B2 | 8/2021 | Hua et al. | |
| 11,133,325 B2 | 9/2021 | Dai et al. | |
| 11,152,386 B2 | 10/2021 | Or-Bach et al. | |
| 11,170,836 B1 | 11/2021 | Tang | |
| 11,195,846 B2 | 12/2021 | Huo | |
| 11,355,516 B2 | 1/2022 | Yang et al. | |
| 11,404,091 B2 | 8/2022 | Lin et al. | |
| 11,423,966 B2 | 8/2022 | Lin et al. | |
| 11,587,823 B2 | 2/2023 | Chia et al. | |
| 11,776,602 B2 | 10/2023 | Lin et al. | |
| 2002/0130345 A1 | 9/2002 | Saigoh et al. | |
| 2004/0058493 A1 | 3/2004 | Demange et al. | |
| 2010/0044778 A1 | 2/2010 | Seol et al. | |
| 2010/0123177 A1 | 5/2010 | Ozaki | |
| 2010/0181610 A1 | 7/2010 | Kim et al. | |
| 2010/0207186 A1 | 8/2010 | Higashi et al. | |
| 2011/0049646 A1 | 3/2011 | Lim et al. | |
| 2011/0194357 A1 | 8/2011 | Han et al. | |
| 2011/0199804 A1 | 8/2011 | Son et al. | |
| 2012/0003800 A1 | 1/2012 | Lee et al. | |
| 2012/0104484 A1 | 5/2012 | Lee et al. | |
| 2013/0161821 A1 | 6/2013 | Hwang et al. | |
| 2014/0015057 A1 | 1/2014 | Lee et al. | |
| 2014/0048868 A1 | 2/2014 | Kim et al. | |
| 2014/0160841 A1 | 6/2014 | Koval | |
| 2014/0362644 A1* | 12/2014 | Lue .................. H01L 29/66484 365/185.23 |
| 2015/0200199 A1 | 7/2015 | Sakamoto et al. | |
| 2015/0243674 A1 | 8/2015 | Shih et al. | |
| 2016/0027514 A1 | 1/2016 | Sim et al. | |
| 2016/0071860 A1 | 3/2016 | Kai et al. | |
| 2016/0118404 A1 | 4/2016 | Peng | |
| 2016/0148947 A1 | 5/2016 | Seo et al. | |
| 2016/0163686 A1 | 6/2016 | Lee et al. | |
| 2016/0181259 A1 | 6/2016 | Van Houdt et al. | |
| 2016/0322381 A1 | 11/2016 | Liu et al. | |
| 2017/0148800 A1 | 5/2017 | Nishikawa et al. | |
| 2017/0154895 A1 | 6/2017 | Huo | |
| 2017/0236831 A1 | 8/2017 | Kim | |
| 2017/0301684 A1 | 10/2017 | Park et al. | |
| 2017/0373079 A1* | 12/2017 | Sharangpani .......... H10B 41/27 |
| 2018/0026044 A1 | 1/2018 | Utsumi et al. | |
| 2018/0130823 A1 | 5/2018 | Kim | |
| 2018/0269229 A1 | 9/2018 | Or-Bach et al. | |
| 2019/0067324 A1 | 2/2019 | Zhang et al. | |
| 2019/0115071 A1 | 4/2019 | Nardi et al. | |
| 2019/0123061 A1 | 4/2019 | Liu | |
| 2019/0148286 A1 | 5/2019 | Or-Bach et al. | |
| 2019/0172838 A1 | 6/2019 | Jo et al. | |
| 2019/0287985 A1 | 9/2019 | Shimojo et al. | |
| 2020/0027509 A1 | 1/2020 | Chen et al. | |
| 2020/0119047 A1 | 4/2020 | Yoo et al. | |
| 2020/0152502 A1 | 5/2020 | Hsu | |
| 2020/0168630 A1 | 5/2020 | Borukhov | |
| 2020/0176464 A1 | 6/2020 | Jang et al. | |
| 2020/0176468 A1 | 6/2020 | Herner et al. | |
| 2020/0185411 A1 | 6/2020 | Herner et al. | |
| 2020/0194431 A1 | 6/2020 | Castro et al. | |
| 2020/0227428 A1 | 7/2020 | Liu et al. | |
| 2020/0227727 A1 | 7/2020 | Li | |
| 2020/0286530 A1 | 9/2020 | Lee et al. | |
| 2020/0295033 A1 | 9/2020 | Sakamoto et al. | |
| 2020/0381037 A1 | 12/2020 | Kim et al. | |
| 2021/0043654 A1 | 2/2021 | Yoo et al. | |
| 2021/0118861 A1 | 4/2021 | Yun et al. | |
| 2021/0175253 A1* | 6/2021 | Han ...................... H10B 51/10 |
| 2021/0202514 A1* | 7/2021 | Han .................... H10B 63/845 |
| 2021/0217772 A1 | 7/2021 | Zhang | |
| 2021/0242241 A1 | 8/2021 | Rajashekhar et al. | |
| 2021/0391315 A1 | 12/2021 | Zhang | |
| 2021/0407848 A1 | 12/2021 | Chia et al. | |
| 2022/0020770 A1 | 1/2022 | Yang et al. | |
| 2022/0020771 A1 | 1/2022 | Yang et al. | |
| 2022/0037361 A1 | 2/2022 | Lin et al. | |
| 2022/0037362 A1 | 2/2022 | Lin et al. | |
| 2022/0216223 A1* | 7/2022 | Xu ........................ G11C 16/0483 |
| 2022/0285395 A1* | 9/2022 | Yang ................ H01L 29/78391 |
| 2023/0058806 A1* | 2/2023 | Lin .................... H01L 29/41775 |
| 2023/0225129 A1* | 7/2023 | Lin ...................... H10B 51/10 257/295 |
| 2023/0225131 A1* | 7/2023 | Lin ...................... H01L 25/18 257/295 |

FOREIGN PATENT DOCUMENTS

| | | |
|---|---|---|
| CN | 109075172 A | 12/2018 |
| CN | 110121778 A | 8/2019 |
| CN | 110268523 A | 9/2019 |
| CN | 110447103 A | 11/2019 |
| CN | 110808332 A | 2/2020 |
| CN | 111180451 A | 5/2020 |
| CN | 113540115 A | 10/2021 |
| JP | 2015122478 A | 7/2015 |
| KR | 20090125893 A | 12/2009 |
| KR | 20110112727 A | 10/2011 |
| KR | 20140008622 A | 1/2014 |
| KR | 20140024632 A | 3/2014 |
| KR | 20170048393 A | 5/2017 |
| KR | 20170089378 A | 8/2017 |
| KR | 20170131945 A | 12/2017 |
| KR | 20190012061 A | 2/2019 |
| KR | 20190064852 A | 6/2019 |
| KR | 20190105604 A | 9/2019 |
| KR | 20190118751 A | 10/2019 |
| KR | 20200008828 A | 1/2020 |
| KR | 20200035469 A | 4/2020 |
| KR | 20210045538 A | 4/2021 |
| TW | 461083 B | 10/2001 |
| TW | 201510994 A | 3/2015 |
| TW | 201737434 A | 10/2017 |
| TW | 201814839 A | 4/2018 |
| TW | 201905916 A | 2/2019 |
| TW | 201913971 A | 4/2019 |
| TW | 201946253 A | 12/2019 |

(56) References Cited

FOREIGN PATENT DOCUMENTS

| TW | 202010102 A | 3/2020 |
| WO | 2018136730 A1 | 7/2018 |
| WO | 2018136734 A1 | 7/2018 |
| WO | 2021029916 A1 | 2/2021 |

OTHER PUBLICATIONS

Lue, H. et al., "A Novel 3D AND-type NVM Architecture Capable of High-density, Low-power In-Memory Sum-of-Product Computation for Artificial Intelligence Application," 2018 IEEE Symposium on VLSI Technology, Jun. 18-22, 2018, 2 pages.

* cited by examiner

THREE-DIMENSIONAL MEMORY DEVICE

PRIORITY CLAIM AND CROSS-REFERENCE

This application is a divisional of U.S. patent application Ser. No. 17/012,848, filed on Sep. 4, 2020, entitled, "Three-Dimensional Memory Device and Method," which claims the benefit of U.S. Provisional Application No. 63/031,694, filed on May 29, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
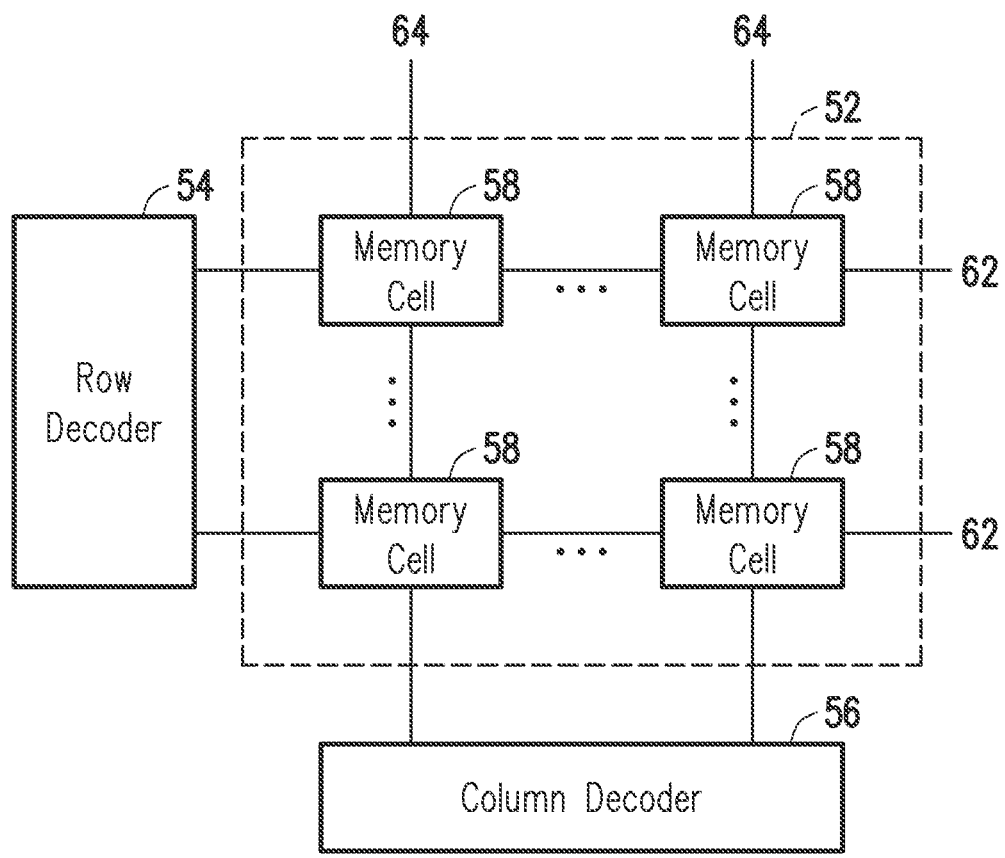
FIG. 1 is a block diagram of a random-access memory, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, word lines for a memory array are formed by a multiple-patterning process, in which first portions of the word lines and a first subset of the transistors for the memory array are formed in a first patterning process, and in which second portions of the word lines and a second subset of the transistors for the memory array are subsequently formed in a second patterning process. The aspect ratio of the columns of the memory array may thus be improved while twisting or collapsing of the features during formation is avoided.

FIG. 1 is a block diagram of a random-access memory 50, in accordance with some embodiments. The random-access memory 50 includes a memory array 52, a row decoder 54, and a column decoder 56. The memory array 52, the row decoder 54, and the column decoder 56 may each be part of a same semiconductor die, or may be parts of different semiconductor dies. For example, the memory array 52 can be part of a first semiconductor die, while the row decoder 54 and the column decoder 56 can be parts of a second semiconductor die.

The memory array 52 includes memory cells 58, word lines 62, and bit lines 64. The memory cells 58 are arranged in rows and columns. The word lines 62 and the bit lines 64 are electrically connected to the memory cells 58. The word lines 62 are conductive lines that extend along the rows of the memory cells 58. The bit lines 64 are conductive lines that extend along the columns of the memory cells 58.

The row decoder 54 may be, e.g., a static CMOS decoder, a pseudo-NMOS decoder, or the like. During operation, the row decoder 54 selects desired memory cells 58 in a row of the memory array 52 by activating the word line 62 for the row. The column decoder 56 may be, e.g., a static CMOS decoder, a pseudo-NMOS decoder, or the like, and may include writer drivers, sense amplifiers, combinations thereof, or the like. During operation, the column decoder 56 selects bit lines 64 for the desired memory cells 58 from columns of the memory array 52 in the selected row, and reads data from or writes data to the selected memory cells 58 with the bit lines 64.

Figure 2A:
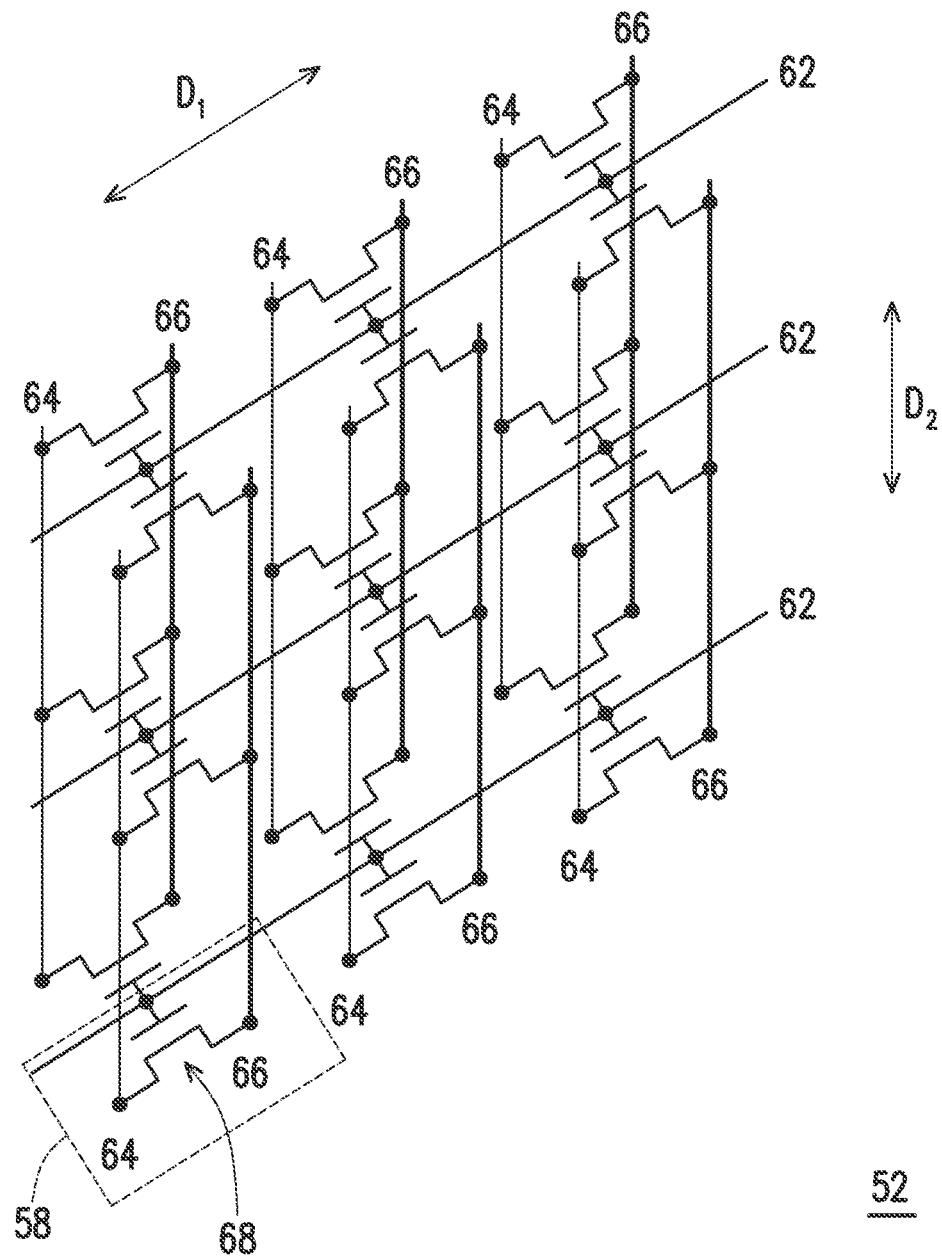
FIGS. 2A and 2B are various views of a memory array, in accordance with some embodiments.
Figure 2B:
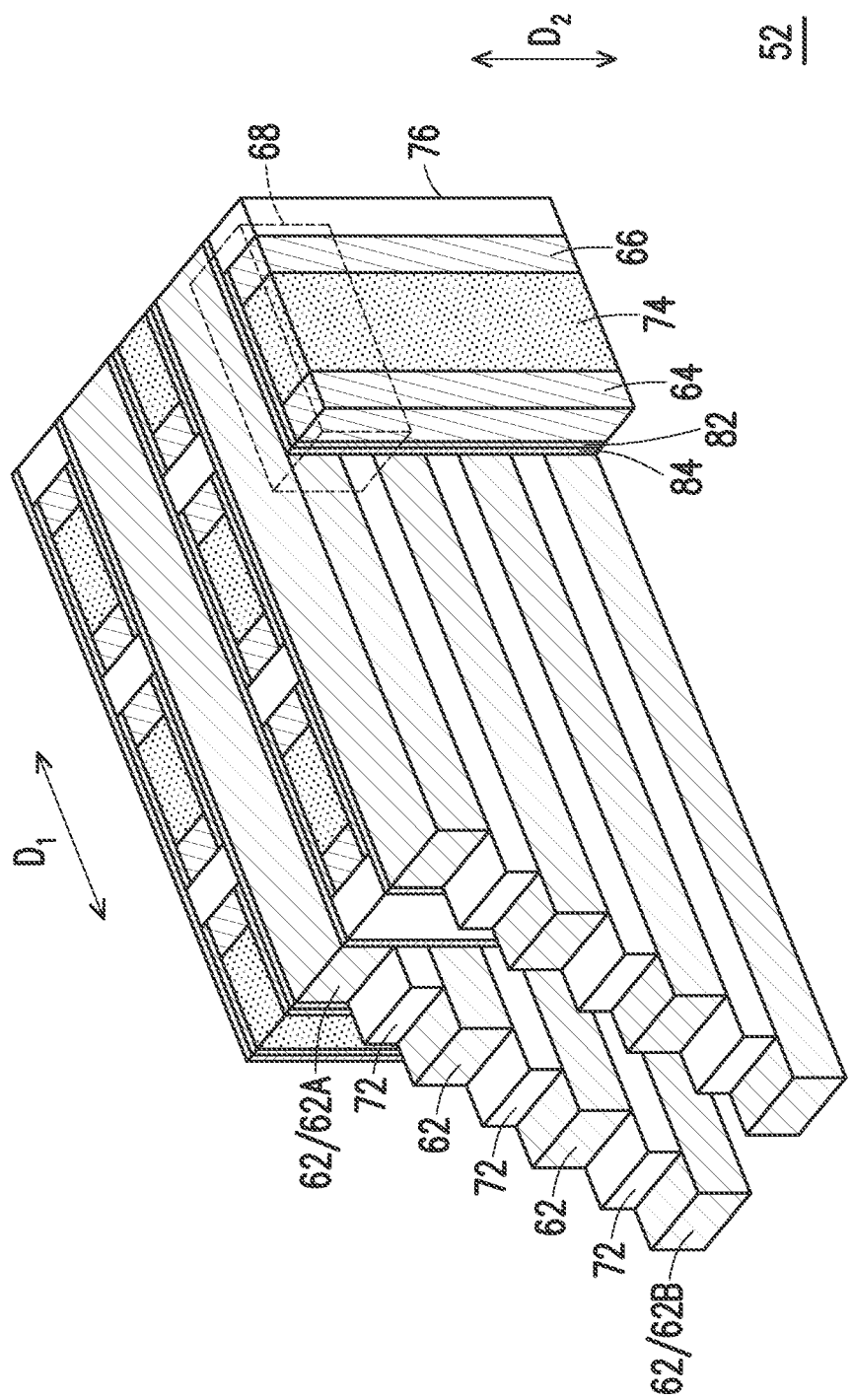

FIGS. 2A and 2B are various views of a memory array 52, in accordance with some embodiments. FIG. 2A is a circuit diagram of the memory array 52. FIG. 2B is a three-dimensional view of a portion of the memory array 52.

In some embodiments, the memory array 52 is a flash memory array, such as a NOR flash memory array. In some embodiments, the memory array 52 is another type of non-volatile memory array, such as a magnetoresistive random-access memory (MRAM) array, a resistive random-access memory (RRAM) array, or the like. Each of the memory cells 58 is a flash memory cell that includes a thin film transistor (TFT) 68. The gate of each TFT 68 is electrically connected to a respective word line 62, a first source/drain region of each TFT 68 is electrically connected to a respective bit line 64, and a second source/drain region of each TFT 68 is electrically connected to a respective source line 66 (which are electrically connected to ground). The memory cells 58 in a same row of the memory array 52 share a common word line 62 while the memory cells in a same column of the memory array 52 share a common bit line 64 and a common source line 66.

The memory array 52 includes multiple horizontally arranged conductive lines (e.g., the word lines 62) with each of the word lines 62 disposed between dielectric layers 72. The word lines 62 extend in a first direction $D_1$ that is parallel to a major surface of an underlying substrate (not shown in FIG. 2B, but discussed in greater detail below with respect to FIGS. 3A through 14B). The word lines 62 may have a staircase arrangement such that lower word lines 62 are longer than and extend laterally past endpoints of upper word lines 62. For example, in FIG. 2B, multiple, stacked layers of word lines 62 are illustrated with topmost word lines 62A being the shortest lines and bottommost word lines 62B being the longest lines. Respective lengths of the word lines 62 increases in a direction extending towards the underlying substrate. In this manner, a portion of each word line 62 may be accessible from above the memory array 52, so that conductive contacts may be formed to an exposed portion of each word line 62.

The memory array 52 further includes multiple vertically arranged conductive lines (e.g., the bit lines 64 and the source lines 66). The bit lines 64 and the source lines 66 extend in a second direction $D_2$ that is perpendicular to the first direction $D_1$ and the major surface of the underlying substrate. A dielectric layer 74 is disposed between and isolates adjacent ones of the bit lines 64 and the source lines 66. The boundaries of each memory cell 58 are defined by pairs of the bit lines 64 and the source lines 66 along with an intersecting word line 62. A dielectric plug 76 is disposed between and isolates adjacent pairs of the bit lines 64 and the source lines 66. Although FIGS. 2A and 2B illustrate a particular placement of the bit lines 64 relative the source lines 66, it should be appreciated that the placement of the bit lines 64 and the source lines 66 may be flipped in other embodiments.

The memory array 52 further includes ferroelectric strips 84 and semiconductor strips 82. The ferroelectric strips 84 are in contact with the word lines 62. The semiconductor strips 82 are disposed between the ferroelectric strips 84 and the dielectric layer 74.

The semiconductor strips 82 provide channel regions for the TFTs 68 of the memory cells 58. For example, when an appropriate voltage (e.g., higher than a respective threshold voltage ($V_{th}$) of a corresponding TFT 68) is applied through a corresponding word line 62, a region of a semiconductor strip 82 that intersects the word line 62 may allow current to flow from the bit line 64 to the source lines 66 (e.g., in the direction $D_1$).

The ferroelectric strips 84 are data-storing layers that may be polarized in one of two different directions by applying an appropriate voltage differential across the ferroelectric strips 84. Depending on a polarization direction of a particular region of a ferroelectric strip 84, a threshold voltage of a corresponding TFT 68 varies and a digital value (e.g., 0 or 1) can be stored. For example, when a region of ferroelectric strip 84 has a first electrical polarization direction, the corresponding TFT 68 may have a relatively low threshold voltage, and when the region of the ferroelectric strip 84 has a second electrical polarization direction, the corresponding TFT 68 may have a relatively high threshold voltage. The difference between the two threshold voltages may be referred to as the threshold voltage shift. A larger threshold voltage shift makes it easier (e.g., less error prone) to read the digital value stored in the corresponding memory cell 58. Accordingly, the memory array 52 may also be referred to as a ferroelectric random access memory (FE-RAM) array.

To perform a write operation on a particular memory cell 58, a write voltage is applied across a region of the ferroelectric strip 84 corresponding to the memory cell 58. The write voltage can be applied, for example, by applying appropriate voltages to the word line 62, the bit line 64, and the source line 66 corresponding to the memory cell 58. By applying the write voltage across the region of the ferroelectric strip 84, a polarization direction of the region of the ferroelectric strip 84 can be changed. As a result, the corresponding threshold voltage of the corresponding TFT 68 can be switched from a low threshold voltage to a high threshold voltage (or vice versa), so that a digital value can be stored in the memory cell 58. Because the word lines 62 and the bit lines 64 intersect in the memory array 52, individual memory cells 58 may be selected and written to.

To perform a read operation on a particular memory cell 58, a read voltage (a voltage between the low and high threshold voltages) is applied to the word line 62 corresponding to the memory cell 58. Depending on the polarization direction of the corresponding region of the ferroelectric strip 84, the TFT 68 of the memory cell 58 may or may not be turned on. As a result, the bit line 64 may or may not be discharged (e.g., to ground) through the source line 66, so that the digital value stored in the memory cell 58 can be determined. Because the word lines 62 and the bit lines 64 intersect in the memory array 52, individual memory cells 58 may be selected and read from.

FIGS. 3A through 14B are various views of intermediate stages in the manufacturing of a memory array 52, in accordance with some embodiments. A portion of the memory array 52 is illustrated. Some features, such as the staircase arrangement of the word lines (see FIG. 2B), are not shown for clarity of illustration. FIGS. 3A, 4A, 5A, 6A, 7A, 8A, 9A, 10A, 11A, 12A, 13A, and 14A are three-dimensional views of the memory array 52. FIGS. 3B, 4B, 5B, 6B, 7B, 8B, 9B, 10B, 11B, 12B, 13B, and 14B are a cross-sectional views shown along reference cross-section B-B in FIG. 13A.

Figure 3A:
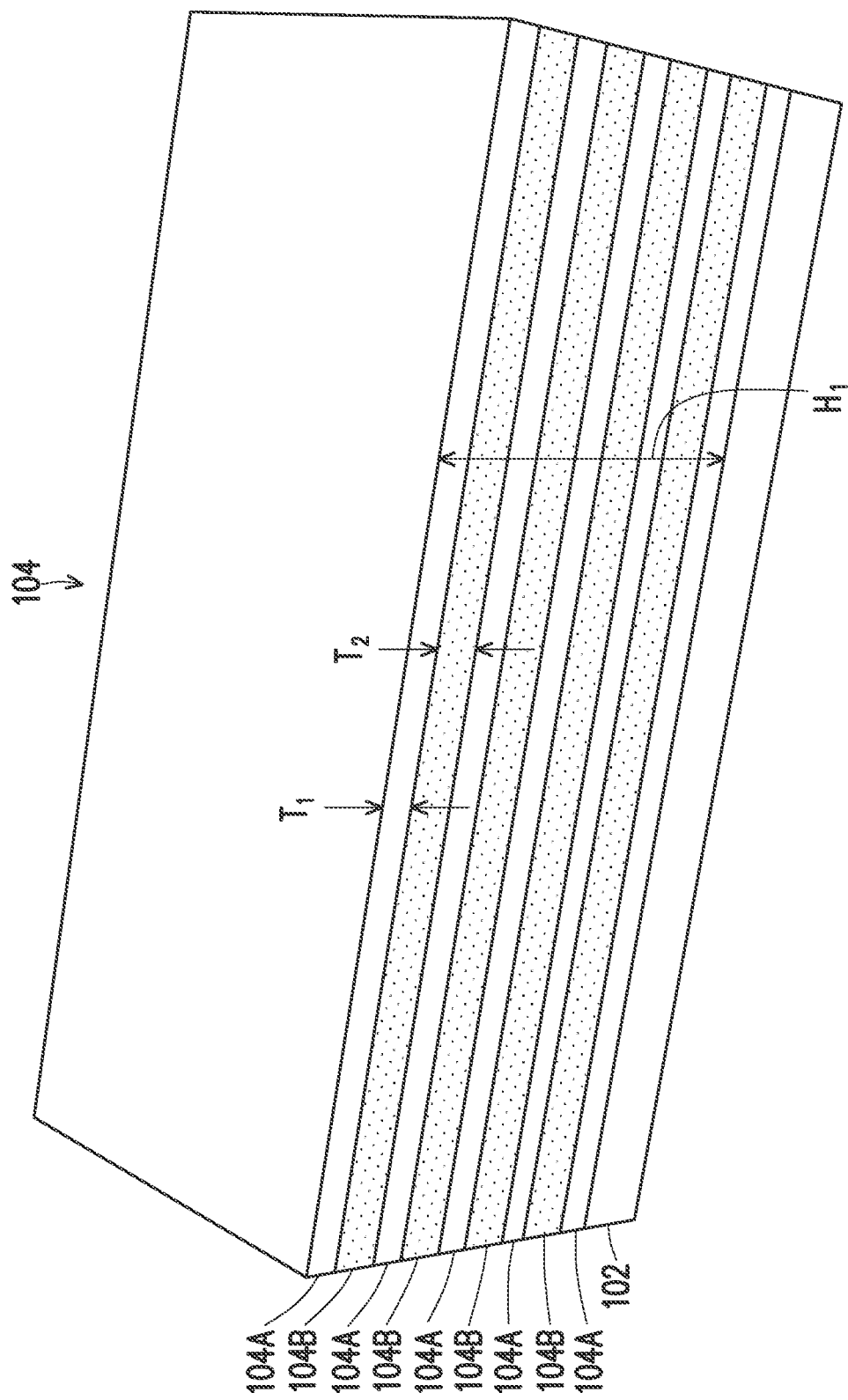
FIGS. 3A through 14B are various views of intermediate stages in the manufacturing of a memory array, in accordance with some embodiments.
Figure 3B:
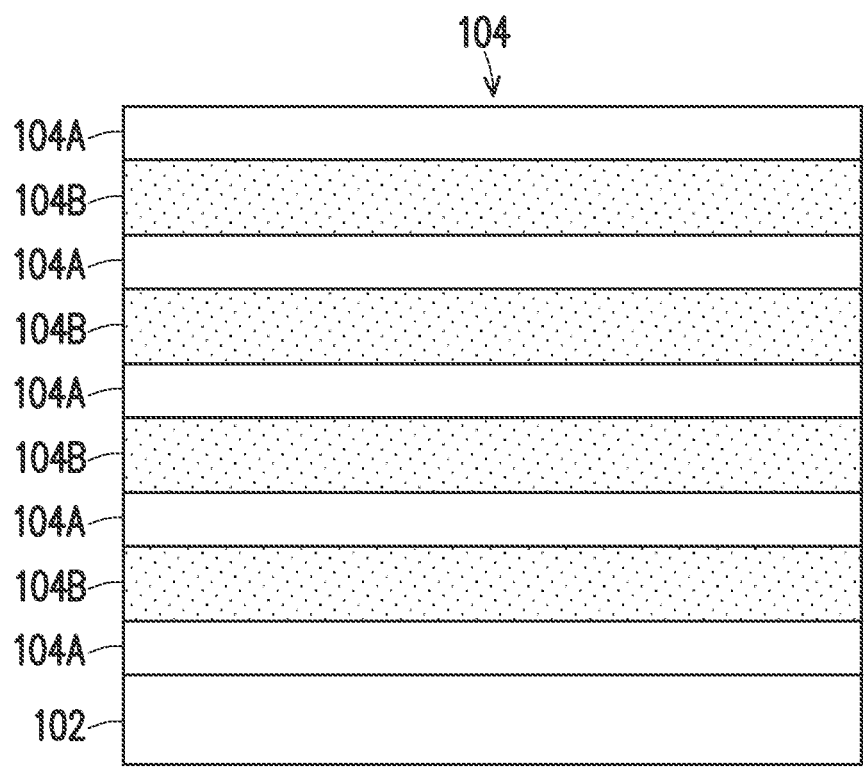

In FIGS. 3A and 3B, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multilayered or gradient substrate may also be used. In some embodiments, the semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. The substrate 102 may include a dielectric material. For example, the substrate 102 may be a dielectric substrate, or may include a dielectric layer on a semiconductor substrate. Acceptable dielectric materials for dielectric substrates include oxides such as silicon oxide; nitrides such as silicon nitride; carbides such as silicon carbide; the like; or combinations thereof such as silicon oxynitride, silicon oxycarbide, silicon carbonitride, or the like. In some embodiments, the substrate 102 is formed of silicon carbide.

A multilayer stack 104 is formed over the substrate 102. The multilayer stack 104 includes alternating first dielectric layers 104A and second dielectric layers 104B. The first dielectric layers 104A are formed of a first dielectric material, and the second dielectric layers 104B are formed of a second dielectric material. The dielectric materials may each be selected from the candidate dielectric materials of the substrate 102. In the illustrated embodiment, the multilayer stack 104 includes five layers of the first dielectric layers 104A and four layers of the second dielectric layers 104B. It should be appreciated that the multilayer stack 104 may include any number of the first dielectric layers 104A and the second dielectric layers 104B.

The multilayer stack 104 will be patterned in subsequent processing. As such, the dielectric materials of the first dielectric layers 104A and the second dielectric layers 104B both have a high etching selectivity from the etching of the substrate 102. The patterned first dielectric layers 104A will be used to isolate subsequently formed TFTs. The patterned second dielectric layers 104B are sacrificial layers (or dummy layers), which will be removed in subsequent processing and replaced with word lines for the TFTs. As such, the second dielectric material of the second dielectric layers 104B also has a high etching selectivity from the etching of the first dielectric material of the first dielectric layers 104A. In embodiments where the substrate 102 is formed of silicon carbide, the first dielectric layers 104A can be formed of an oxide such as silicon oxide, and the second dielectric layers 104B can be formed of a nitride such as silicon nitride. Other combinations of dielectric materials having acceptable etching selectivity from one another may also be used.

Each layer of the multilayer stack 104 may be formed by an acceptable deposition process such as chemical vapor deposition (CVD), atomic layer deposition (ALD), or the like. A thickness of each of the layers may be in the range of about 15 nm to about 90 nm. In some embodiments, the first dielectric layers 104A are formed to a different thickness than the second dielectric layers 104B. For example, the first dielectric layers 104A can be formed to a first thickness $T_1$ and the second dielectric layers 104B can be formed to a second thickness $T_2$, with the second thickness $T_2$ being from about 0% to about 100% greater than or less than the first thickness $T_1$. The multilayer stack 104 can have an overall height $H_1$ in the range of about 1000 nm to about 10000 nm.

As will be discussed in greater detail below, FIGS. 4A through 11B illustrate a process in which trenches are patterned in the multilayer stack 104 and TFTs are formed in the trenches. Specifically, a multiple-patterning process is used to form the TFTs. The multiple-patterning process may be a double patterning process, a quadruple patterning process, or the like. FIGS. 4A through 11B illustrate a double patterning process. In a double patterning process, first trenches 106 (see FIGS. 4A and 4B) are patterned in the multilayer stack 104 with a first etching process, and components for a first subset of the TFTs are formed in the first trenches 106. Second trenches 120 (see FIGS. 8A and 8B) are then patterned in the multilayer stack 104 with a second etching process, and a second subset of the TFTs are formed in the second trenches 120. Forming the TFTs with a multiple-patterning process allows each patterning process to be performed with a low pattern density, which can help reduce defects while still allowing the memory array 52 to have sufficient memory cell density. Forming the TFTs with a multiple-patterning process also allows each patterned portion of the multilayer stack 104 to avoid having an excessively large aspect ratio, thereby improving the structural stability of the resulting memory array.

Figure 4A:
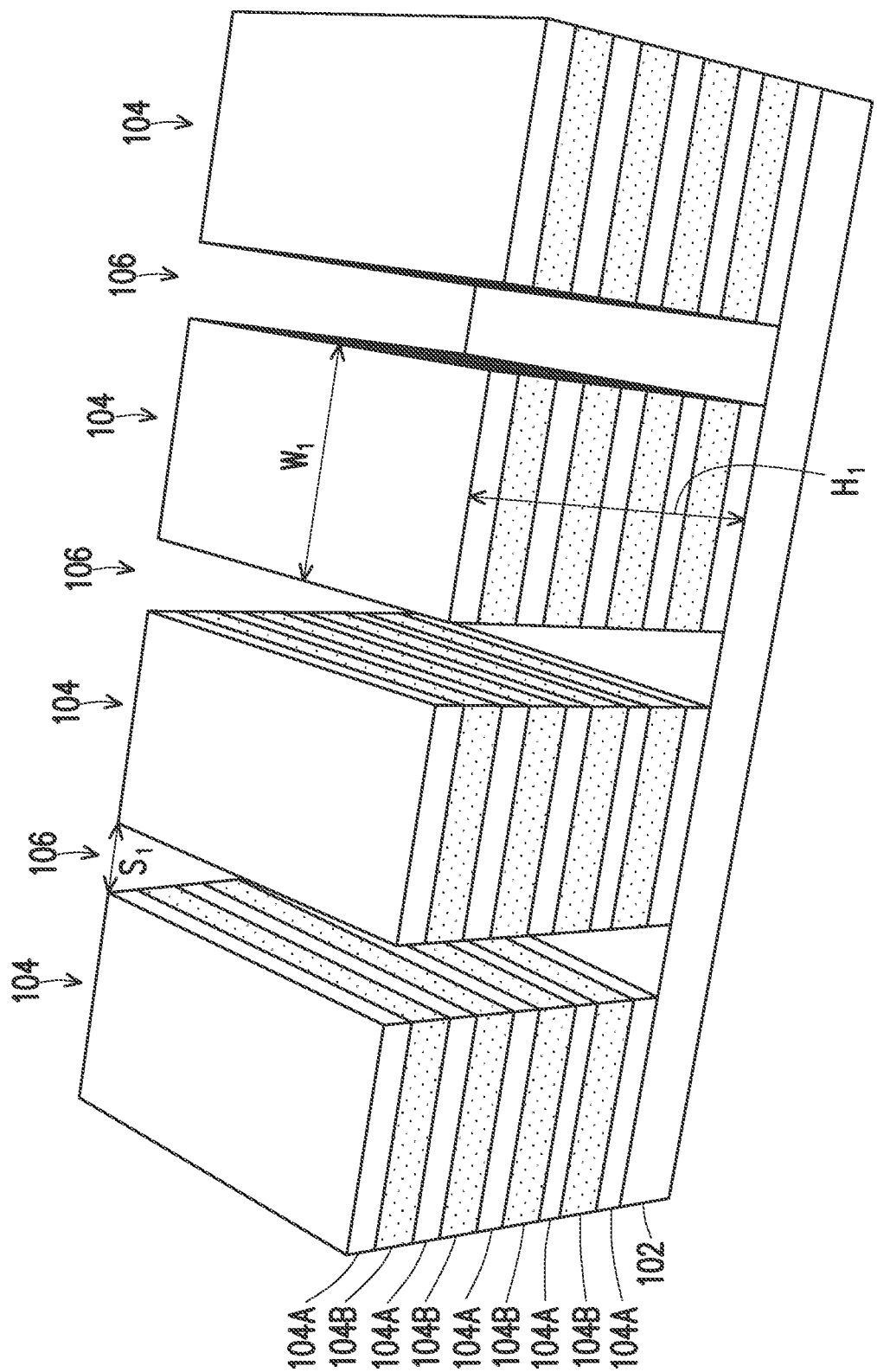
Figure 4B:
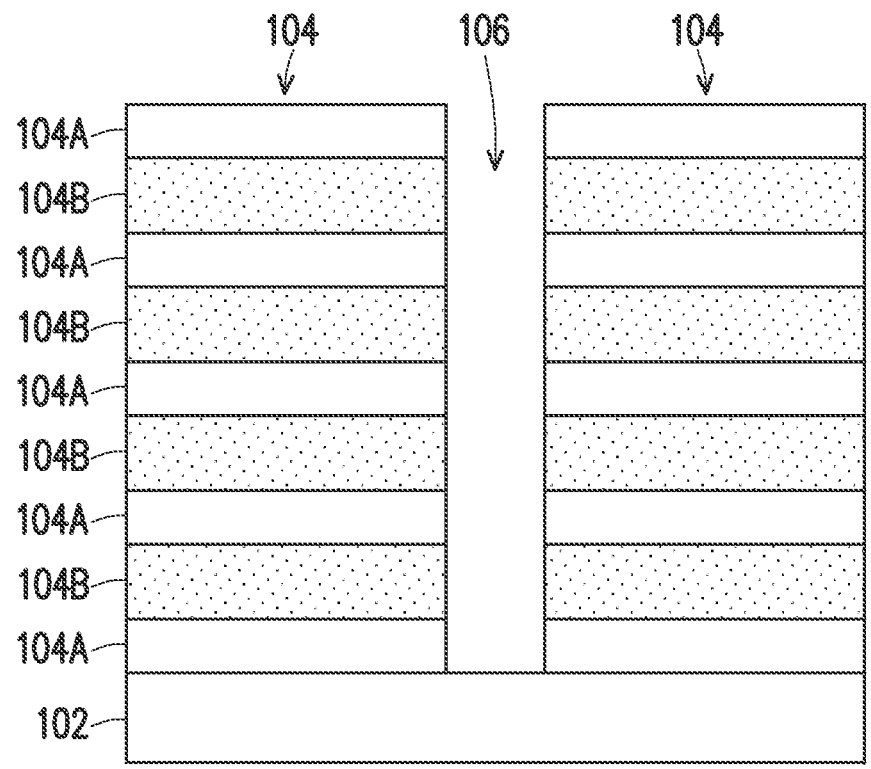

In FIGS. 4A and 4B, first trenches 106 are formed in the multilayer stack 104. In the illustrated embodiment, the first trenches 106 extend through the multilayer stack 104 and expose the substrate 102. In another embodiment, the first trenches 106 extend through some but not all layers of the multilayer stack 104. The first trenches 106 may be formed using acceptable photolithography and etching techniques, such as with an etching process that is selective to the multilayer stack 104 (e.g., etches the dielectric materials of the first dielectric layers 104A and the second dielectric layers 104B at a faster rate than the material of the substrate 102). The etching may be any acceptable etch process, such as a reactive ion etch (RIE), neutral beam etch (NBE), the like, or a combination thereof. The etching may be anisotropic. In embodiments where the substrate 102 is formed of silicon carbide, the first dielectric layers 104A are formed of silicon oxide, and the second dielectric layers 104B are formed of silicon nitride, the first trenches 106 can be formed by a dry etch using a fluorine-based gas (e.g., $C_4F_6$) mixed with hydrogen ($H_2$) or oxygen ($O_2$) gas.

A portion of the multilayer stack 104 is disposed between each pair of the first trenches 106. Each portion of the multilayer stack 104 can have a width $W_1$ in the range of about 50 nm to about 500 nm, and has the height $H_1$ discussed with respect to FIGS. 3A and 3B. Further, each portion of the multilayer stack 104 is separated by a separation distance $S_1$, which can be in the range of about 50 nm to about 200 nm. The aspect ratio (AR) of each portion of the multilayer stack 104 is the ratio of the height $H_1$ to the width of the narrowest feature of the portion of the multilayer stack 104, which is the width $W_1$ at this step of processing. In accordance with some embodiment, when the first trenches 106 are formed, the aspect ratio of each portion of the multilayer stack 104 is in the range of about 5 to about 15. Forming each portion of the multilayer stack 104 with an aspect ratio of less than about 5 may not allow the memory array 52 to have sufficient memory cell density. Forming each portion of the multilayer stack 104 with an aspect ratio of greater than about 15 may cause twisting or collapsing of the multilayer stack 104 in subsequent processing.

Figure 5A:
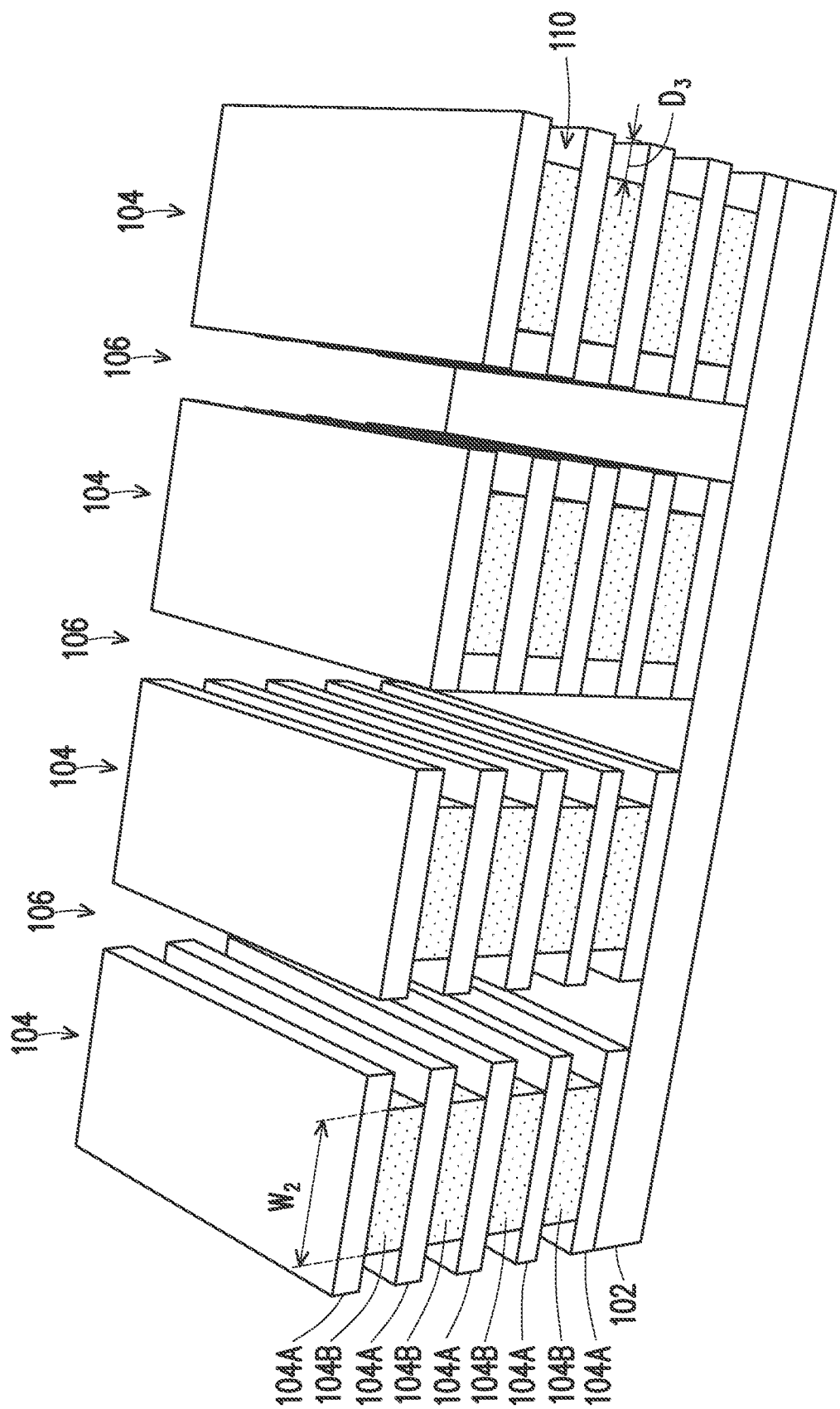
Figure 5B:
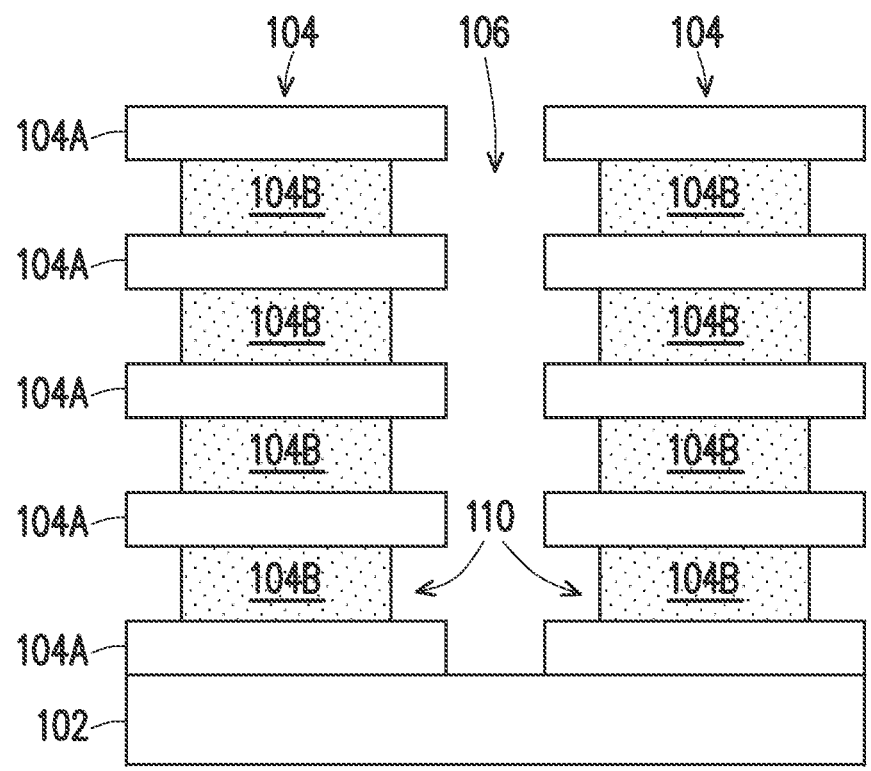

In FIGS. 5A and 5B, the first trenches 106 are expanded to form first sidewall recesses 110. Specifically, portions of the sidewalls of the second dielectric layers 104B exposed by the first trenches 106 are recessed form the first sidewall recesses 110. Although sidewalls of the second dielectric layers 104B are illustrated as being straight, the sidewalls may be concave or convex. The first sidewall recesses 110 may be formed by an acceptable etching process, such as one that is selective to the material of the second dielectric layers 104B (e.g., selectively etches the material of the second dielectric layers 104B at a faster rate than the materials of the first dielectric layers 104A and the substrate 102). The etching may be isotropic. In embodiments where the substrate 102 is formed of silicon carbide, the first dielectric layers 104A are formed of silicon oxide, and the second dielectric layers 104B are formed of silicon nitride, the first trenches 106 can be expanded by a wet etch using phosphoric acid ($H_3PO_4$). In another embodiment, a dry etch selective to the material of the second dielectric layers 104B may be used.

After formation, the first sidewall recesses 110 have a depth $D_3$ extending past the sidewalls of the first dielectric layers 104A. Timed etch processes may be used to stop the etching of the first sidewall recesses 110 after the first sidewall recesses 110 reach a desired depth $D_3$. For example, the first sidewall recesses 110 can have have a depth $D_3$ in the range of about 10 nm to about 60 nm. Forming the first sidewall recesses 110 reduces the width of the second dielectric layers 104B. Continuing the previous example, the second dielectric layers 104B can have a width $W_2$ in the range of about 50 nm to about 450 nm after the etching. As noted above, the aspect ratio (AR) of each portion of the multilayer stack 104 is the ratio of the height $H_1$ to the width of the narrowest feature of the portion of the multilayer stack 104, which is the width $W_2$ at this step of processing. Forming the first sidewall recesses 110 thus increases the aspect ratio of each portion of the multilayer stack 104. In accordance with some embodiments, after forming the first sidewall recesses 110, the aspect ratio of each portion of the multilayer stack 104 remains in the range discussed above, e.g., the range of about 5 to about 15. The advantages of such an aspect ratio (discussed above) may thus still be achieved.

Figure 6A:
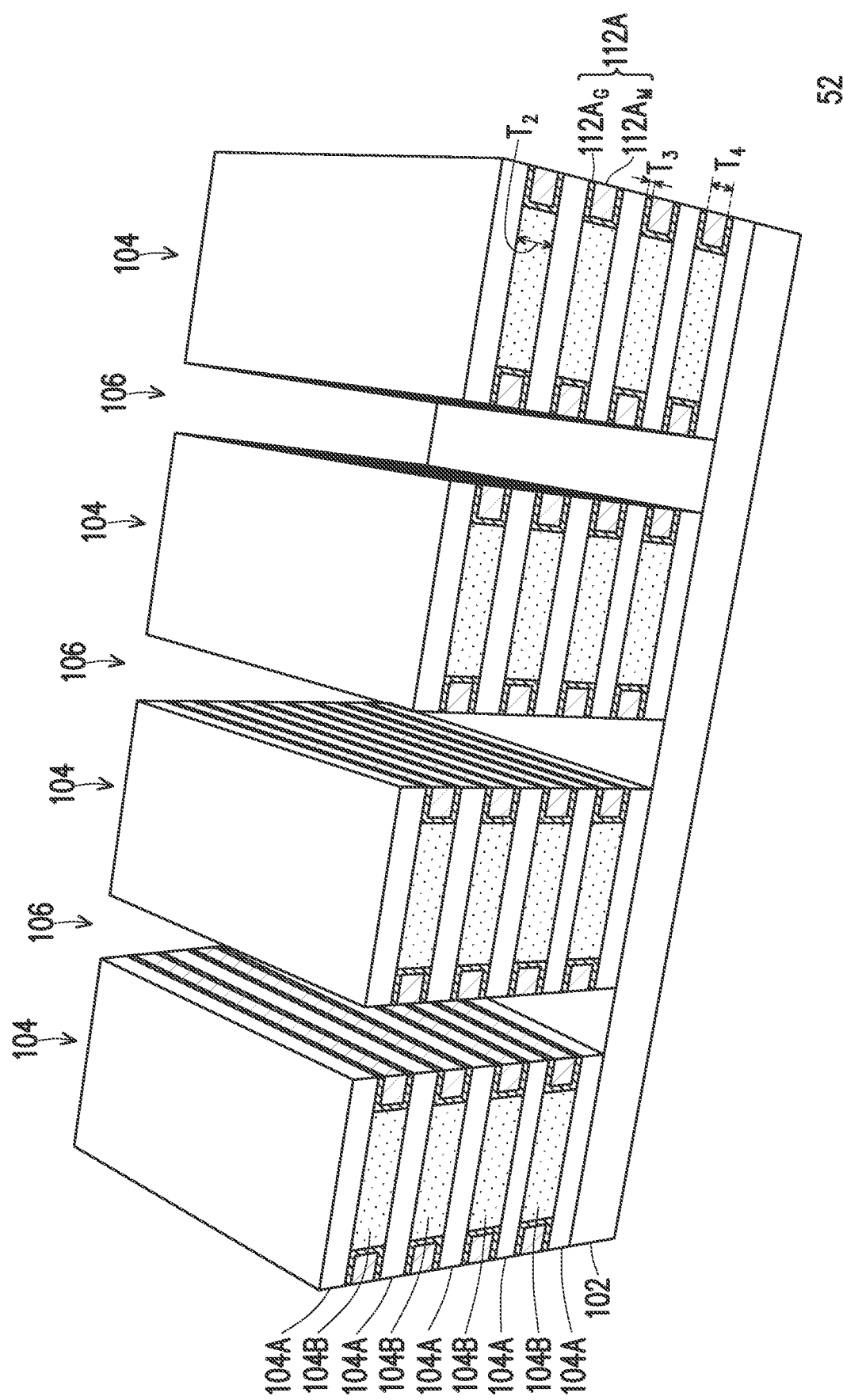
Figure 6B:
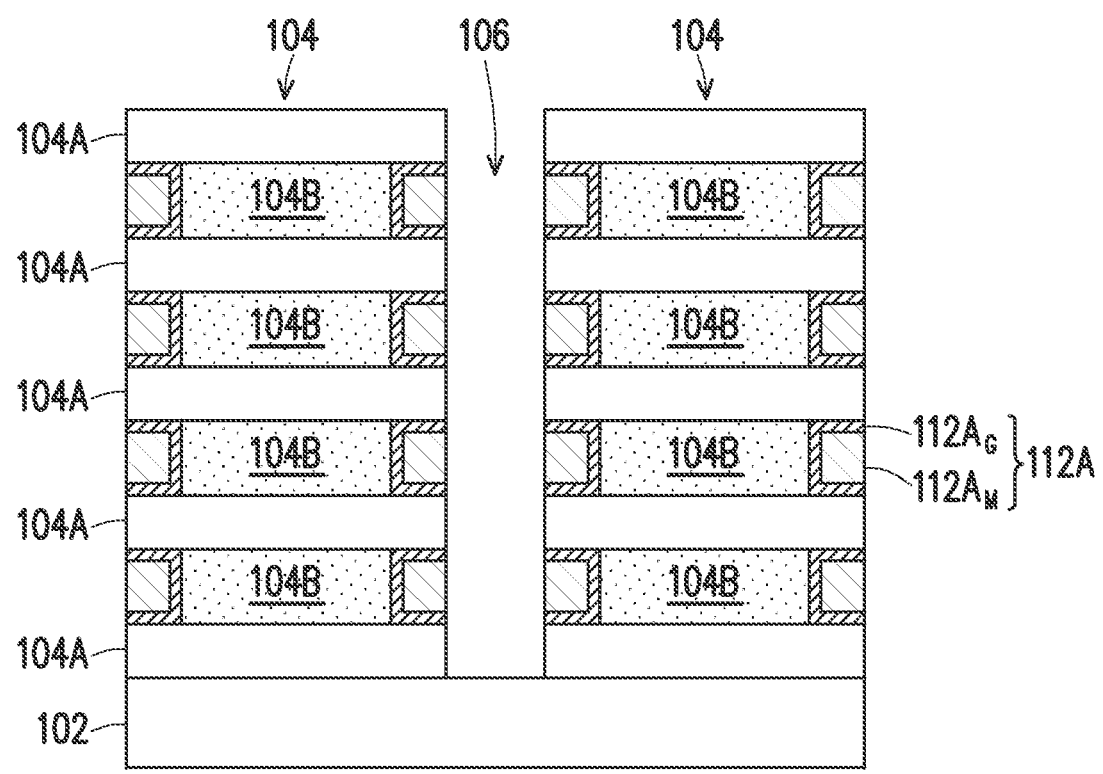

In FIGS. 6A and 6B, first conductive features 112A are formed in the first sidewall recesses 110, thus completing a process for replacing first portions of the second dielectric layers 104B. The first conductive features 112A may each comprise one or more layers, such as glue layers, barrier layers, diffusion layers, and fill layers, and the like. In some embodiments, the first conductive features 112A each include a glue layer $112A_G$ and a main layer $112A_M$. Each glue layer $112A_G$ extends along three sides (e.g., the top surface, a sidewall, and the bottom surface) of a corresponding main layer $112A_M$. The glue layers $112A_G$ are formed of a first conductive material, such as a metal nitride, such as titanium nitride, tantalum nitride, molybdenum nitride, zirconium nitride, hafnium nitride, or the like. The main layers $112A_M$ may are formed of a second conductive material, such as a metal, such as tungsten, ruthenium, molybdenum, cobalt, aluminum, nickel, copper, silver, gold, alloys thereof, or the like. The material of the glue layers $112A_G$ is one that has good adhesion to the material of the first dielectric layers 104A, and the material of the main layers $112A_M$ is one that has good adhesion to the material of the glue layers $112A_G$. In embodiments where the first dielectric layers 104A are formed of an oxide such as silicon oxide, the glue layers $112A_G$ can be formed of titanium nitride and the main layers $112A_M$ can be formed of tungsten. The glue layers $112A_G$ and main layers $112A_M$ may each be formed by an acceptable deposition process such as chemical vapor deposition (CVD), atomic layer deposition (ALD), or the like. An acceptable etch process, such as a dry etch (e.g., a reactive ion etch (RIE), neutral beam etch (NBE), the like), a wet etch, the like, or a combination thereof, may be performed to remove excess material from the sidewalls of the first dielectric layers 104A and the top surface of the substrate 102. The etching may be anisotropic. Each of the first conductive features 112A can have a similar overall thickness $T_2$ as the second dielectric layers 104B (discussed above with respect to FIGS. 3A and 3B), and can have a similar overall width as the depth $D_3$ of the first sidewall recesses 110 (discussed above with respect to FIGS. 5A and 5B). Each glue layer $112A_G$ can have a thickness $T_3$ in the range of about 1 nm to about 10 nm, and each main layer $112A_M$ can have a thickness $T_4$ in the range of about 15 nm to about 35 nm, with the thickness $T_4$ being greater than the thickness $T_3$.

Figure 7A:
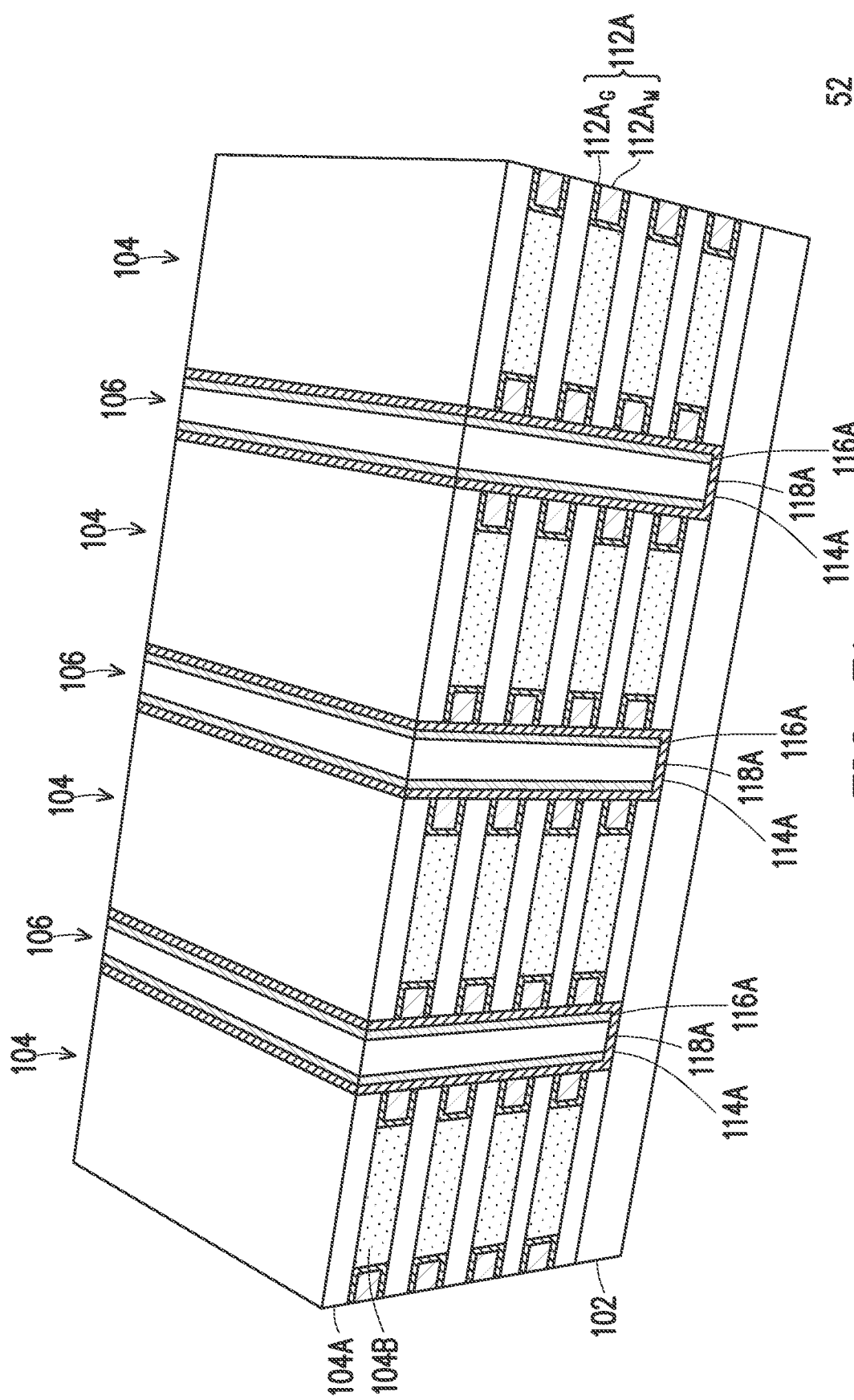
Figure 7B:
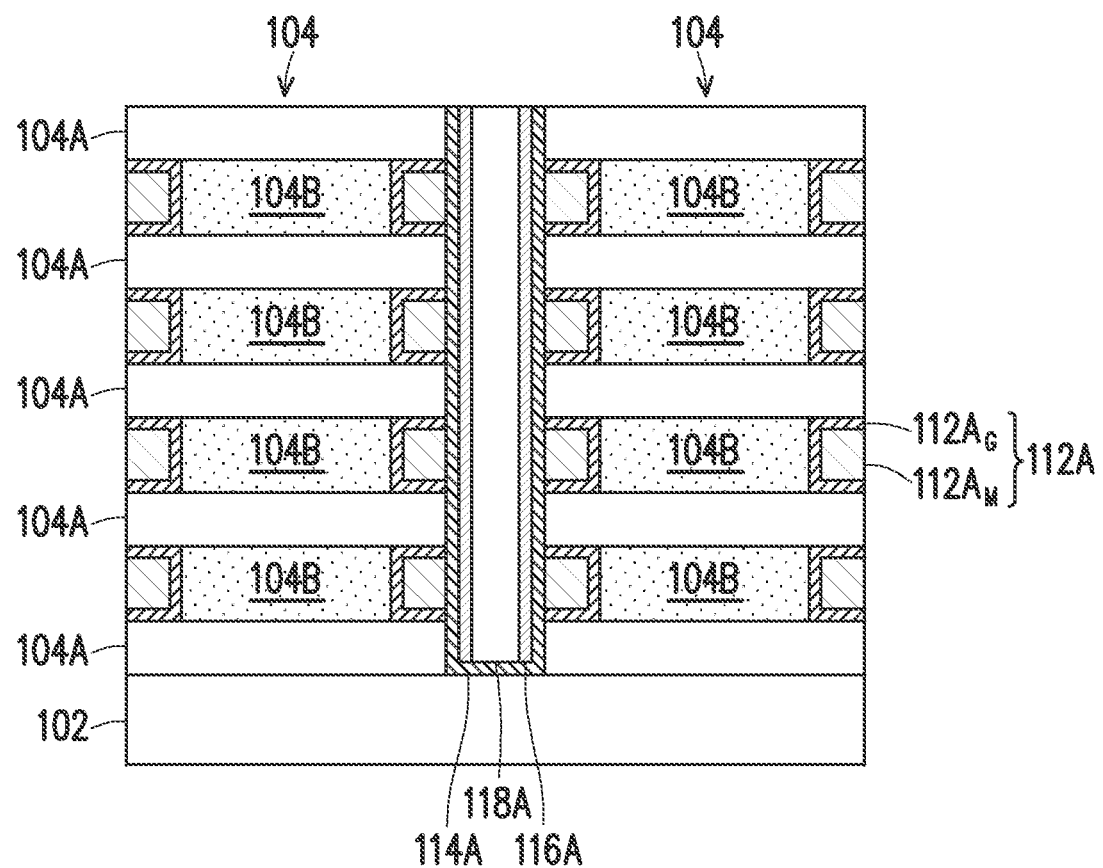

In FIGS. 7A and 7B, TFT film stacks are formed in the first trenches 106. Specifically, two ferroelectric strips 114A, a semiconductor strip 116A, and a dielectric layer 118A are formed in each of the first trenches 106. In this embodiment, no other layers are formed in the first trenches 106. In another embodiment (discussed further below) additional layers are formed in the first trenches 106.

The ferroelectric strips 114A are data storage strips formed of an acceptable ferroelectric material for storing digital values, such as hafnium zirconium oxide (HfZrO); zirconium oxide (ZrO); hafnium oxide (HfO) doped with lanthanum (La), silicon (Si), aluminum (Al), or the like; undoped hafnium oxide (HfO); or the like. The material of the ferroelectric strips 114A may be formed by an acceptable deposition process such as ALD, CVD, physical vapor deposition (PVD), or the like.

The semiconductor strips 116A are formed of an acceptable semiconductor material for providing channel regions of TFTs, such as indium gallium zinc oxide (IGZO), indium tin oxide (ITO), indium gallium zinc tin oxide (IGZTO), zinc oxide (ZnO), polysilicon, amorphous silicon, or the like. The material of the semiconductor strips 116A may be formed by an acceptable deposition process such as ALD, CVD, PVD, or the like.

The dielectric layers 118A are formed of a dielectric material. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, or the like. The material of the dielectric layers 118A may be formed by an acceptable deposition process such as ALD, CVD, flowable CVD (FCVD), or the like.

The ferroelectric strips 114A, the semiconductor strips 116A, and the dielectric layers 118A may be formed by a combination of deposition, etching, and planarization. For example, a ferroelectric layer can be conformally deposited on the multilayer stack 104 and in the first trenches 106 (e.g., on sidewalls of the first conductive features 112A and sidewalls of the first dielectric layers 104A). A semiconductor layer can then be conformally deposited on the ferroelectric layer. The semiconductor layer can then be anisotropically etched to remove horizontal portions of the semiconductor layer, thus exposing the ferroelectric layer. A dielectric layer can then be conformally deposited on the remaining vertical portions of the semiconductor layer and the exposed portions of the ferroelectric layer. A planarization process is then applied to the various layers to remove excess materials over the multilayer stack 104. The planarization process may be a chemical mechanical polish (CMP), an etch-back process, combinations thereof, or the like. The portions of the ferroelectric layer, the semiconductor layer, and the dielectric layer remaining in the first trenches 106 form the ferroelectric strips 114A, the semiconductor strips 116A, and the dielectric layers 118A, respectively. The planarization process exposes the multilayer stack 104 such that top surfaces of the multilayer stack 104, the ferroelectric strips 114A, the semiconductor strips 116A, and the dielectric layers 118A are coplanar (within process variations) after the planarization process.

Figure 8A:
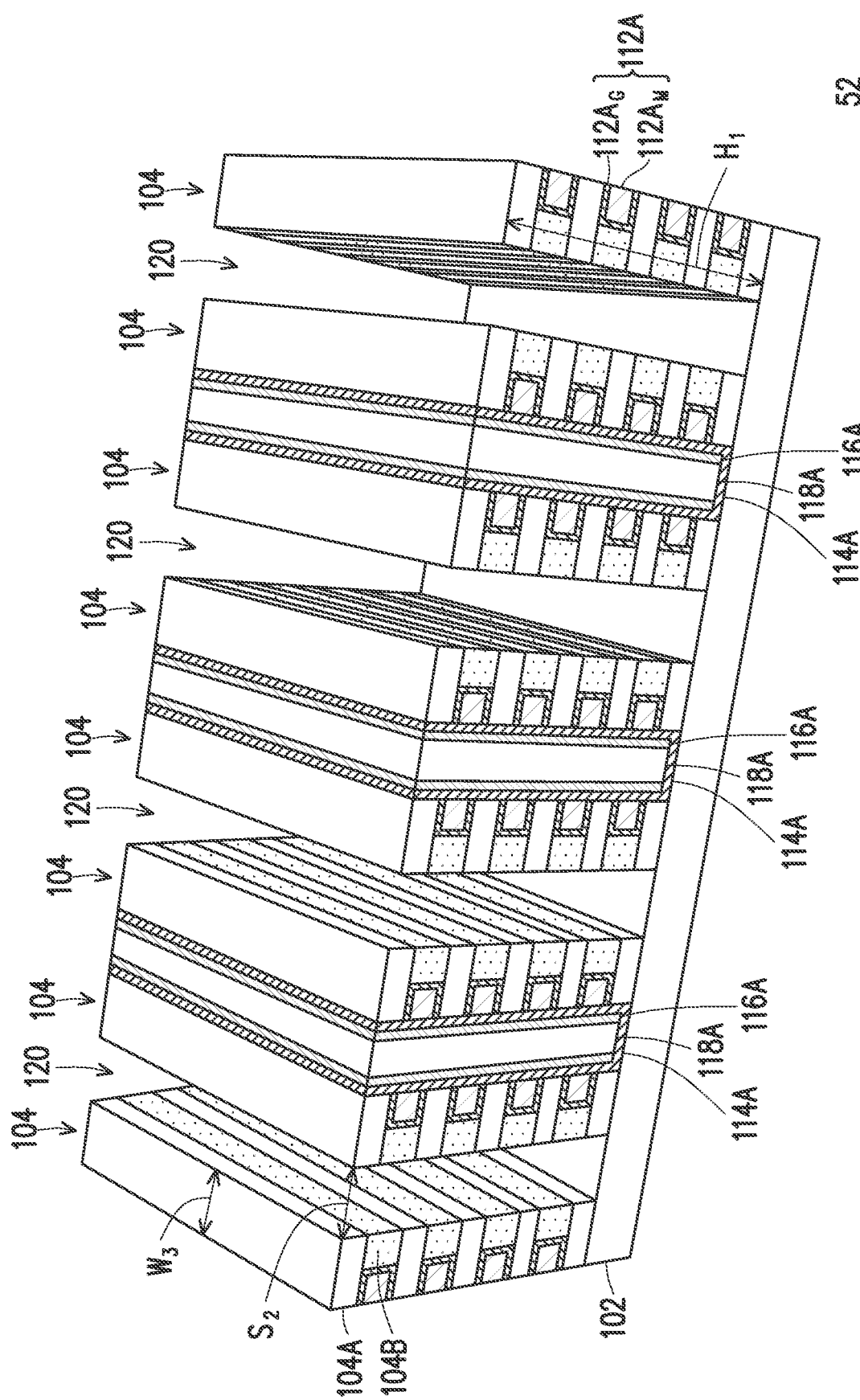
Figure 8B:
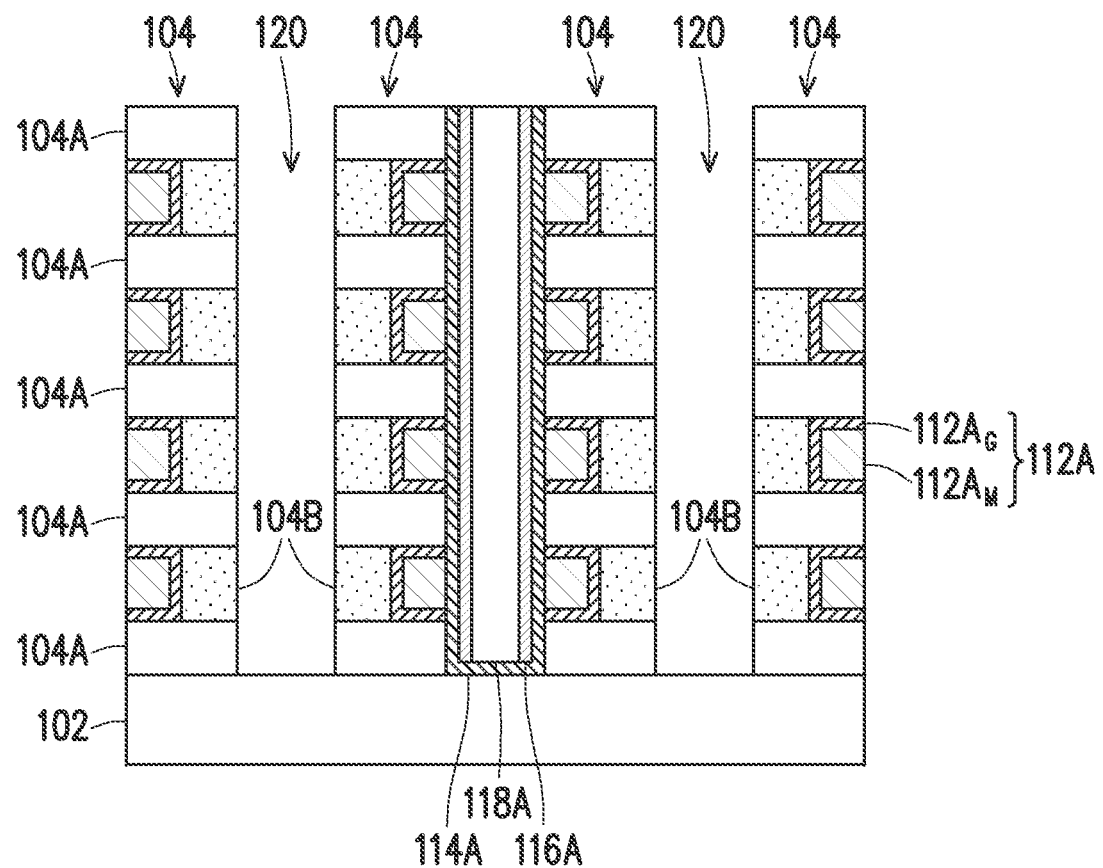

In FIGS. 8A and 8B, second trenches 120 are formed in the multilayer stack 104. In the illustrated embodiment, the second trenches 120 extend through the multilayer stack 104 and expose the substrate 102. In another embodiment, the second trenches 120 extend through some but not all layers of the multilayer stack 104. The second trenches 120 may be formed using acceptable photolithography and etching techniques, such as with an etching process that is selective to the multilayer stack 104 (e.g., etches the dielectric materials of the first dielectric layers 104A and the second dielectric layers 104B at a faster rate than the material of the substrate 102). The etching may be any acceptable etch process, and in some embodiments, may be similar to the etch used to form the first trenches 106 discussed with respect to FIGS. 4A and 4B.

A portion of the multilayer stack 104 is disposed between each second trench 120 and first trench 106. Each portion of the multilayer stack 104 can have a width $W_3$ in the range of about 50 nm to about 500 nm, and has the height $H_1$ discussed with respect to FIGS. 3A and 3B. Further, each portion of the multilayer stack 104 is separated by a separation distance $S_2$, which can be in the range of about 50 nm to about 200 nm. The aspect ratio (AR) of each portion of the multilayer stack 104 is the ratio of the height $H_1$ to the width of the narrowest feature of the portion of the multilayer stack 104, which is the width $W_3$ at this step of processing. In accordance with some embodiment, when the second trenches 120 are formed, the aspect ratio of each portion of the multilayer stack 104 is in the range of about 5 to about 15. Forming each portion of the multilayer stack 104 with an aspect ratio of less than about 5 may not allow the memory array 52 to have sufficient memory cell density. Forming each portion of the multilayer stack 104 with an aspect ratio of greater than about 15 may cause twisting or collapsing of the multilayer stack 104 in subsequent processing.

Figure 9A:
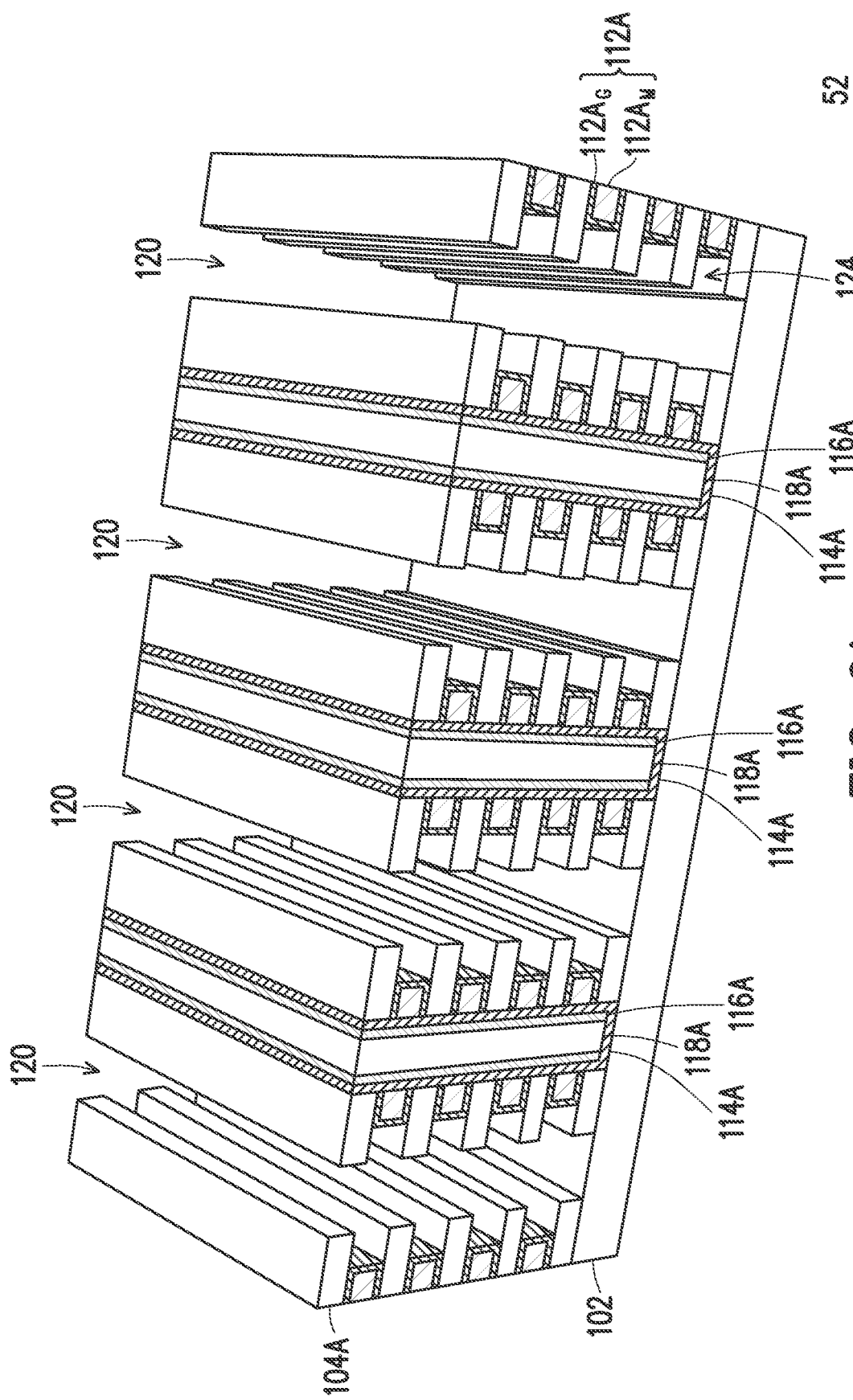
Figure 9B:
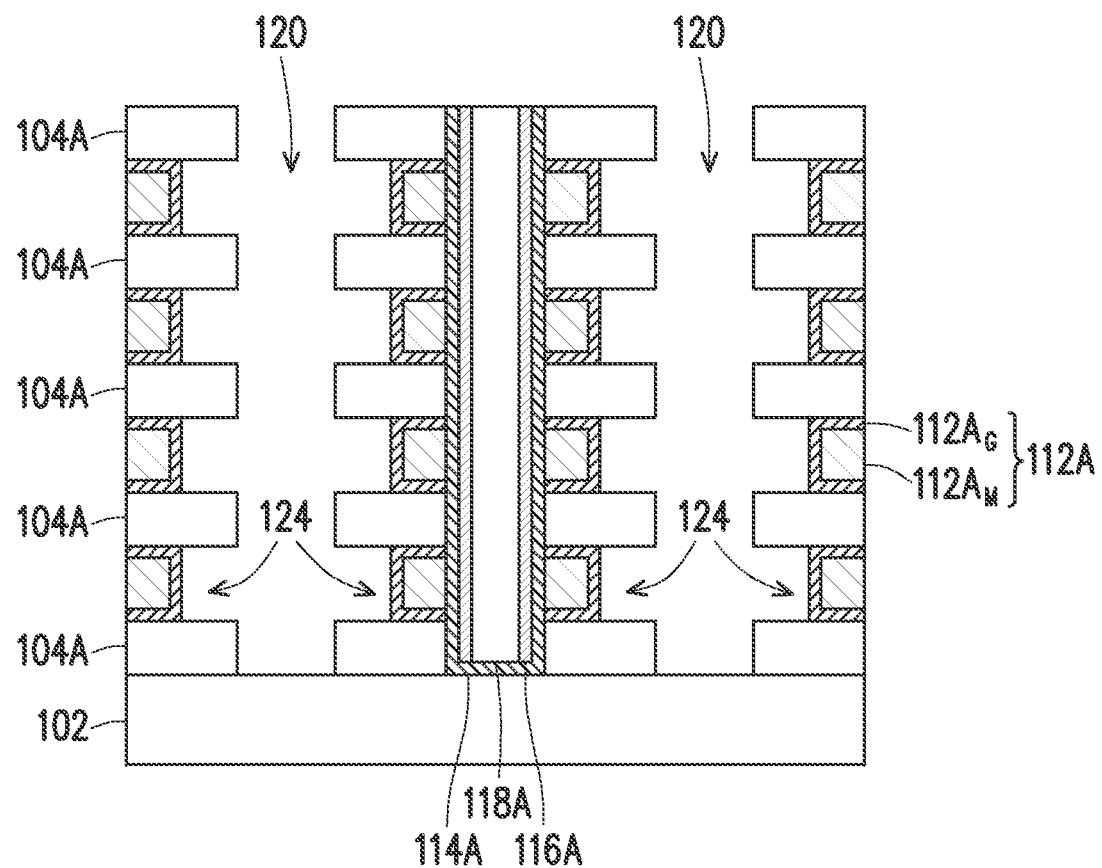

In FIGS. 9A and 9B, the second trenches 120 are expanded to form second sidewall recesses 124. Specifically, the remaining portions of the second dielectric layers 104B removed to form the second sidewall recesses 124. The second sidewall recesses 124 thus expose portions of the first conductive features 112A, e.g., the glue layers $112A_G$. The second sidewall recesses 124 may be formed by an acceptable etching process, such as one that is selective to the material of the second dielectric layers 104B (e.g., selectively etches the material of the second dielectric layers 104B at a faster rate than the materials of the first dielectric layers 104A and the substrate 102). The etching may be any acceptable etch process, and in some embodiments, may be similar to the etch used to form the first sidewall recesses 110 discussed with respect to FIGS. 5A and 5B. After formation, the second sidewall recesses 124 have a depth $D_4$ extending past the sidewalls of the first dielectric layers 104A. In some embodiments, the depth $D_4$ is similar to the depth $D_3$ discussed with respect to FIGS. 5A and 5B. In another embodiment, the depth $D_4$ is different from (e.g., greater than or less than) the depth $D_3$ discussed with respect to FIGS. 5A and 5B.

Figure 10A:
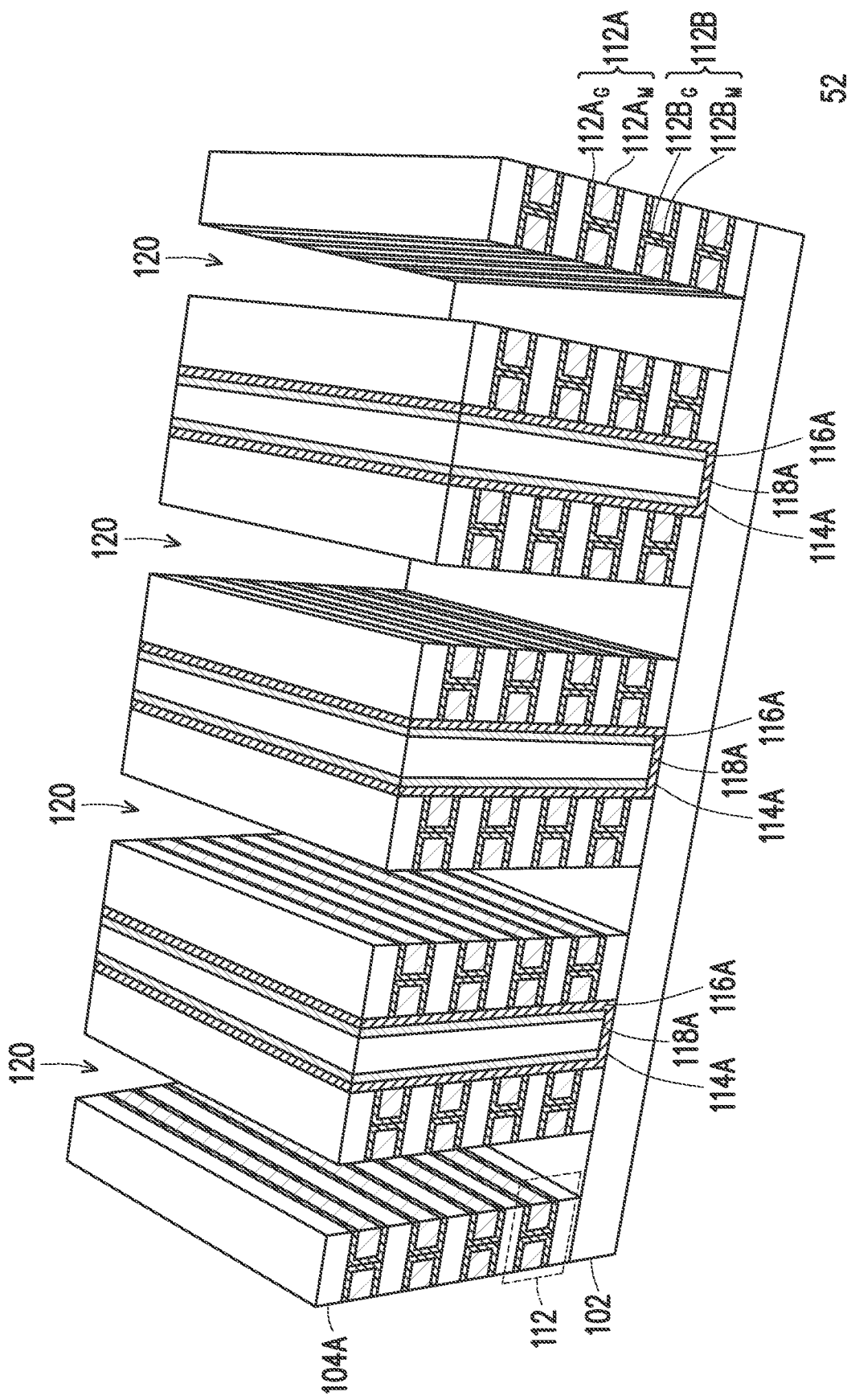
Figure 10B:
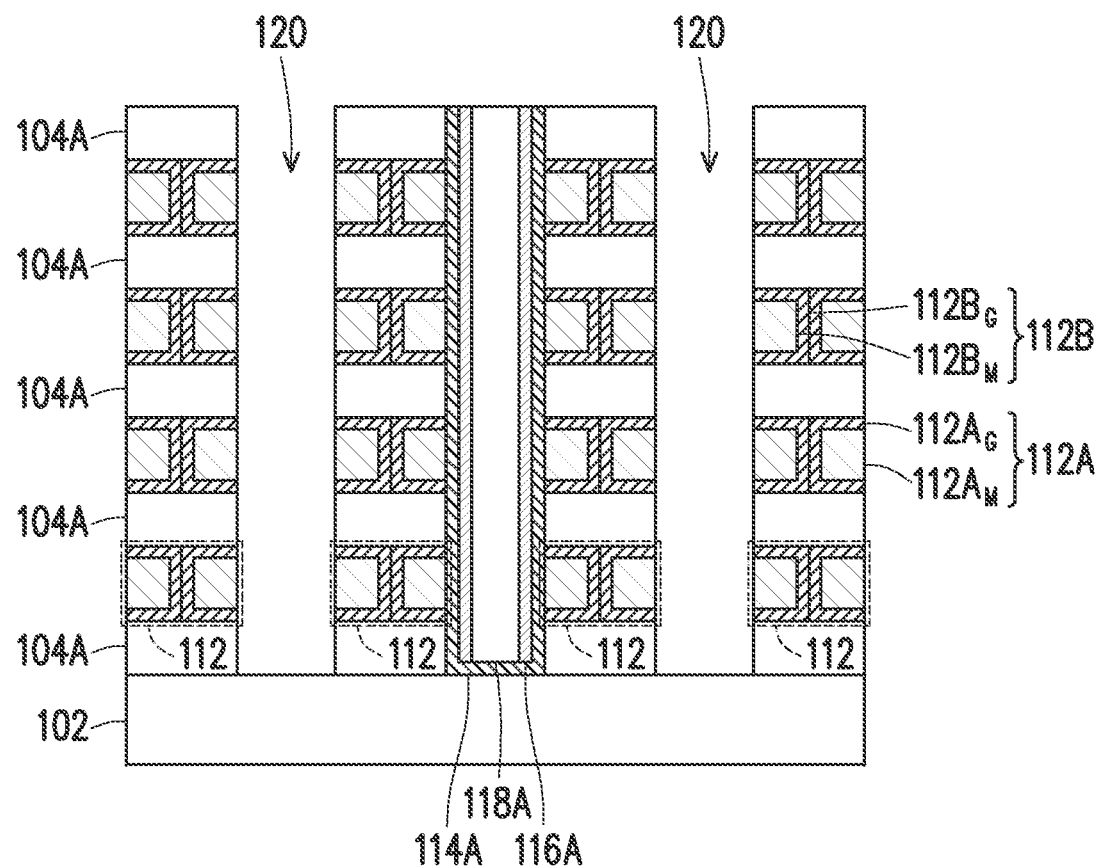

In FIGS. 10A and 10B, second conductive features 112B are formed in the second sidewall recesses 124, thus completing a process for replacing second portions of the second dielectric layers 104B. The second conductive features 112B may be formed of materials that are selected from the same group of candidate materials of the first conductive features 112A, and may be formed using methods that are selected from the same group of candidate methods for forming the materials of the first conductive features 112A. The first conductive features 112A and the second conductive features 112B may be formed from the same material, or may include different materials. In some embodiments, the second conductive features 112B each include a glue layer $112B_G$ and a main layer $112B_M$. The glue layers $112B_G$ and the main layers $112B_M$ of the second conductive features 112B can have similar thicknesses as the glue layers $112A_G$ and the main layers $112A_M$ of the first conductive features 112A, respectively. In some embodiments, the glue layers $112A_G$ and the glue layers $112B_G$ are formed of similar materials, in which case the glue layers $112A_G$ and the glue layers $112B_G$ may merge during formation such that no discernible interfaces exist between them. In another embodiment (discussed further below), the glue layers $112A_G$ and the glue layers $112B_G$ are formed of different materials, in which case the glue layers $112A_G$ and the glue layers $112B_G$ may not merge during formation such that discernible interfaces exist between them.

It should be appreciated that the glue layers $112A_G$, $112B_G$ are optional, and their formation depends on the conductive material of the main layers $112A_M$, $112B_M$. Some conductive materials of the main layers $112A_M$, $112B_M$ may have sufficient adhesion such that the glue layers $112A_G$, $112B_G$ can be omitted.

The first conductive features 112A and the second conductive features 112B are collectively referred to as word lines 112 of the memory array 52. Adjacent pairs of the first conductive features 112A and the second conductive features 112B are in physical contact with one another and are electrically coupled to one another. Thus, each pair of a first conductive feature 112A and a second conductive feature 112B functions as a single word line 112.

Figure 11A:
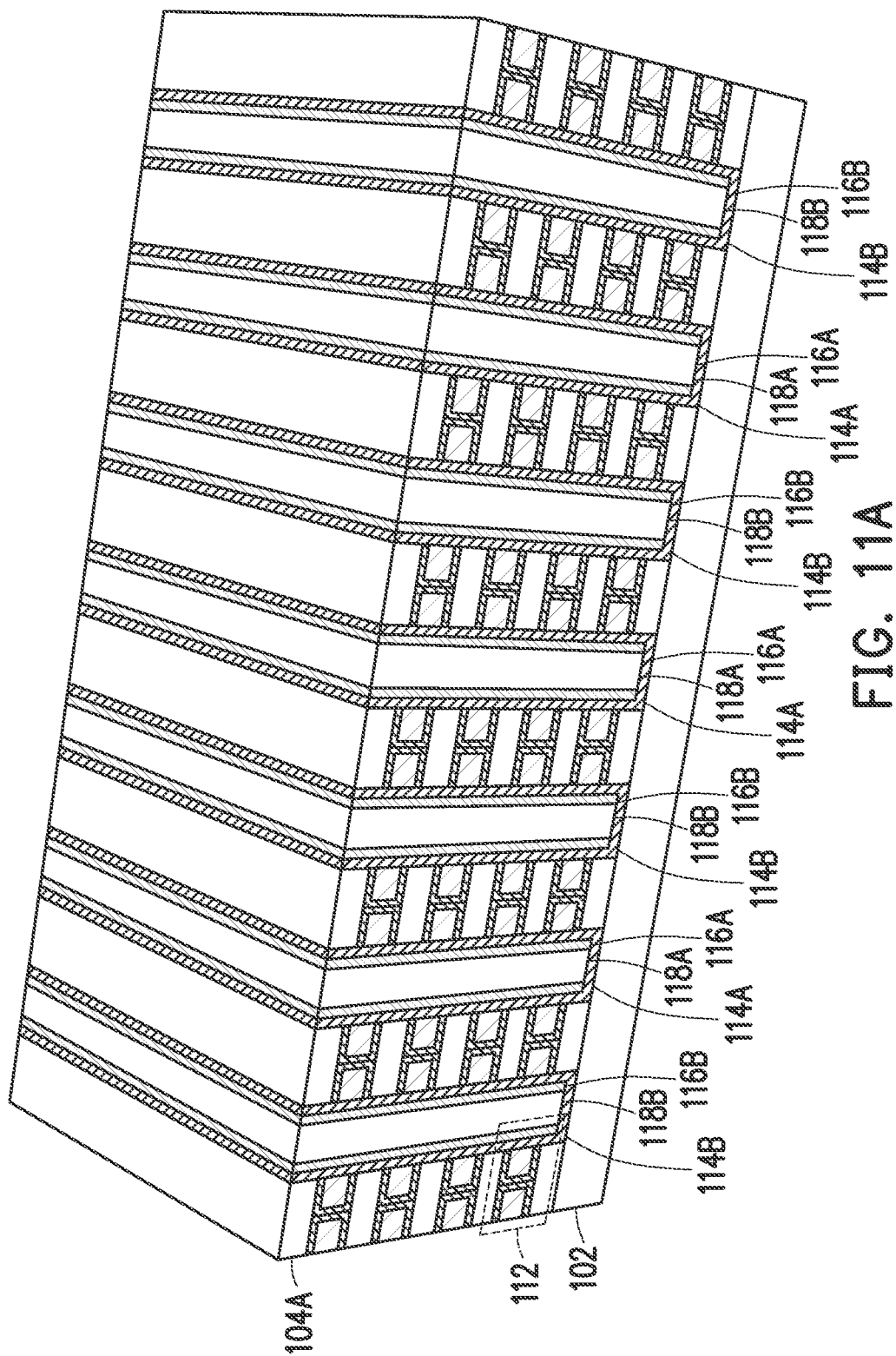
Figure 11B:
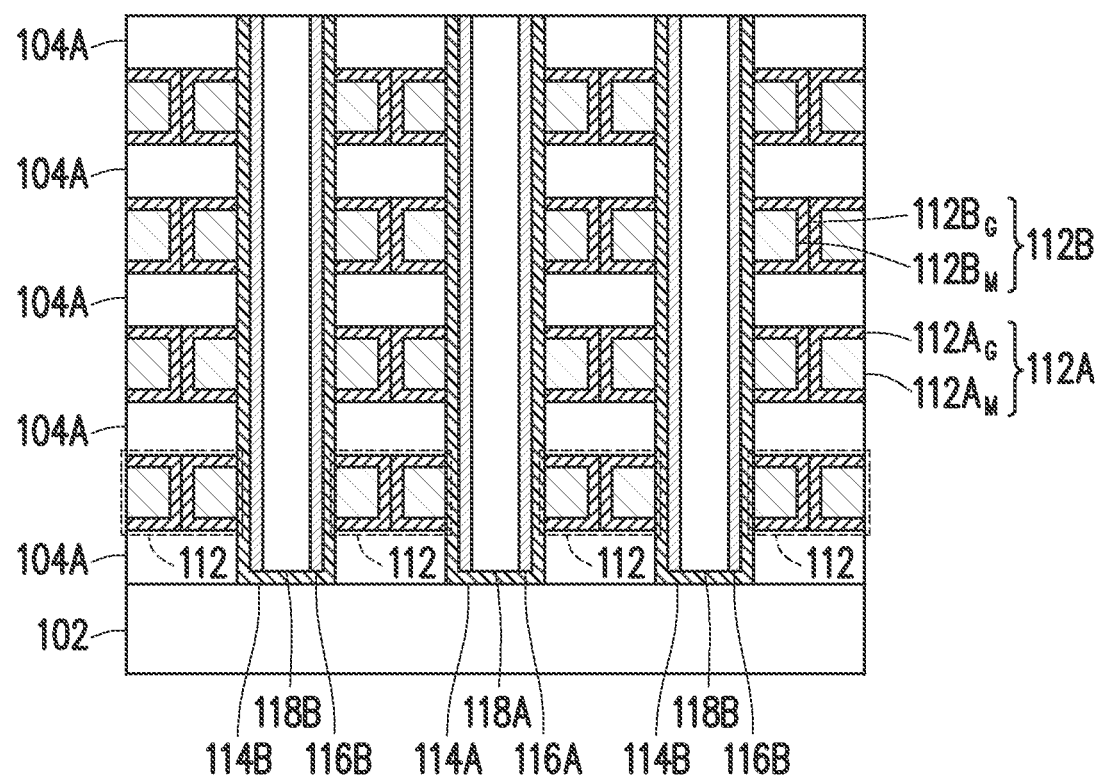

In FIGS. 11A and 11B, TFT film stacks are formed in the second trenches 120. Specifically, two ferroelectric strips 114B, a semiconductor strip 116B, and a dielectric layer 118B are formed in each of the second trenches 120. In this embodiment, no other layers are formed in the second trenches 120. In another embodiment (discussed further below) additional layers are formed in the second trenches 120.

The ferroelectric strips 114B may be formed of a material that is selected from the same group of candidate materials of the ferroelectric strips 114A, and may be formed using a method that is selected from the same group of candidate methods for forming the material of the ferroelectric strips 114A. The ferroelectric strips 114A and the ferroelectric strips 114B may be formed from the same material, or may include different materials. The ferroelectric strips 114A and the ferroelectric strips 114B are collectively referred to as ferroelectric strips 114. A thickness of the ferroelectric strips 114 can be in the range of about 2 nm to about 20 nm.

The semiconductor strips 116B may be formed of a material that is selected from the same group of candidate materials of the semiconductor strips 116A, and may be formed using a method that is selected from the same group of candidate methods for forming the material of the semiconductor strips 116A. The semiconductor strips 116A and the semiconductor strips 116B may be formed from the same material, or may include different materials. The semiconductor strips 116A and the semiconductor strips 116B are collectively referred to as semiconductor strips 116. A thickness of the semiconductor strips 116 can be in the range of about 2 nm to about 20 nm.

The dielectric layers 118B may be formed of a material that is selected from the same group of candidate materials of the dielectric layers 118A, and may be formed using a method that is selected from the same group of candidate methods for forming the material of the dielectric layers 118A. The dielectric layers 118A and the dielectric layers 118B may be formed from the same material, or may include different materials. The dielectric layers 118A and the dielectric layers 118B are collectively referred to as dielectric layers 118. A thickness of the dielectric layers 118 can be in the range of about 42 nm to about 192 nm. The desired thickness of the dielectric layers 118 depends on the thicknesses of the ferroelectric strips 114 and the semiconductor strips 116, and the separation distance $S_2$ after formation of the second trenches 120.

The ferroelectric strips 114B, the semiconductor strips 116B, and the dielectric layers 118B may be formed by a combination of deposition, etching, and planarization. For example, the ferroelectric strips 114B, the semiconductor strips 116B, and the dielectric layers 118B may be formed by a similar combination of steps as that used to form the ferroelectric strips 114A, the semiconductor strips 116A, and the dielectric layers 118A.

Figure 12A:
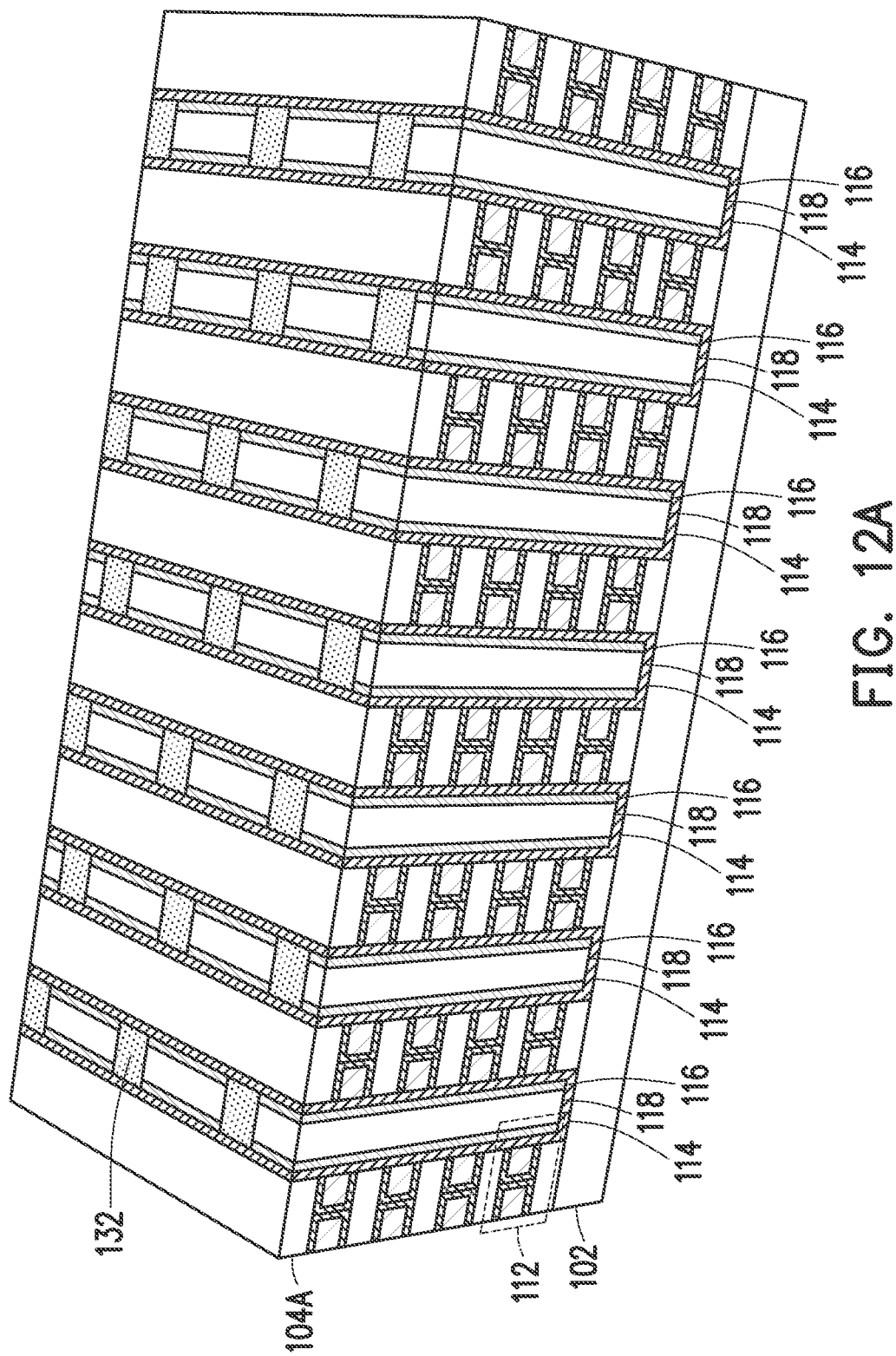
Figure 12B:
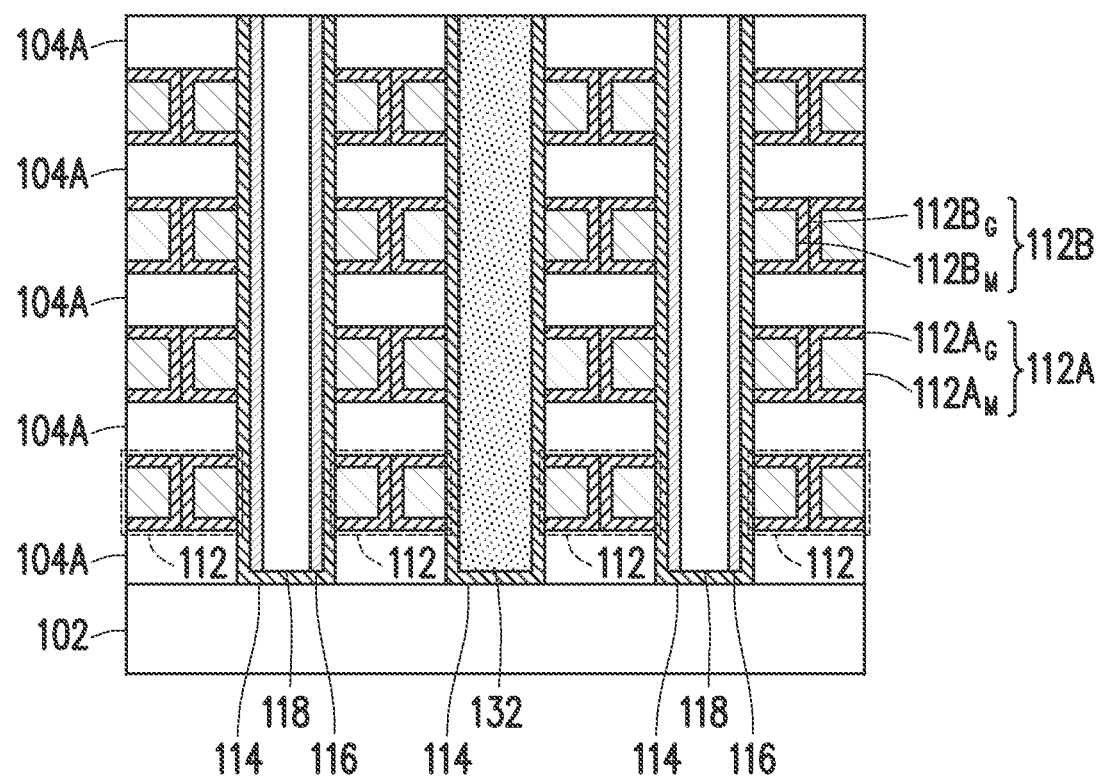

In FIGS. 12A and 12B, dielectric plugs 132 are formed through the dielectric layers 118 and the semiconductor strips 116. The dielectric plugs 132 are isolation columns that will be disposed between adjacent TFTs, and will physically and electrically separate the adjacent TFTs. In the illustrated embodiment, the dielectric plugs 132 do not extend through the ferroelectric strips 114. Different regions of the ferroelectric strips 114 may be independently polarized, and thus the ferroelectric strips 114 can function to store values even when adjacent regions are not physically and electrically separated. In another embodiment, the dielectric plugs 132 are also formed through the ferroelectric strips 114. The dielectric plugs 132 further extend through the first dielectric layers 104A and any remaining portions of the second dielectric layers 104B.

As an example to form the dielectric plugs 132, openings for the dielectric plugs 132 can be formed through the dielectric layers 118 and the semiconductor strips 116. The openings may be formed using acceptable photolithography and etching techniques. One or more dielectric material(s) are then formed in the openings. Acceptable dielectric materials include oxides such as silicon oxide; nitrides such as silicon nitride; carbides such as silicon carbide; the like; or combinations thereof such as silicon oxynitride, silicon oxycarbide, silicon carbonitride, or the like. The dielectric material(s) may be formed by an acceptable deposition process such as ALD, CVD, or the like. In some embodiments, silicon oxide or silicon nitride is deposited in the openings. A planarization process is then applied to the various layers to remove excess dielectric material(s) over the topmost dielectric layer 104A. The planarization process may be a chemical mechanical polish (CMP), an etch-back process, combinations thereof, or the like. The remaining dielectric material(s) form the dielectric plugs 132 in the openings.

Figure 13A:
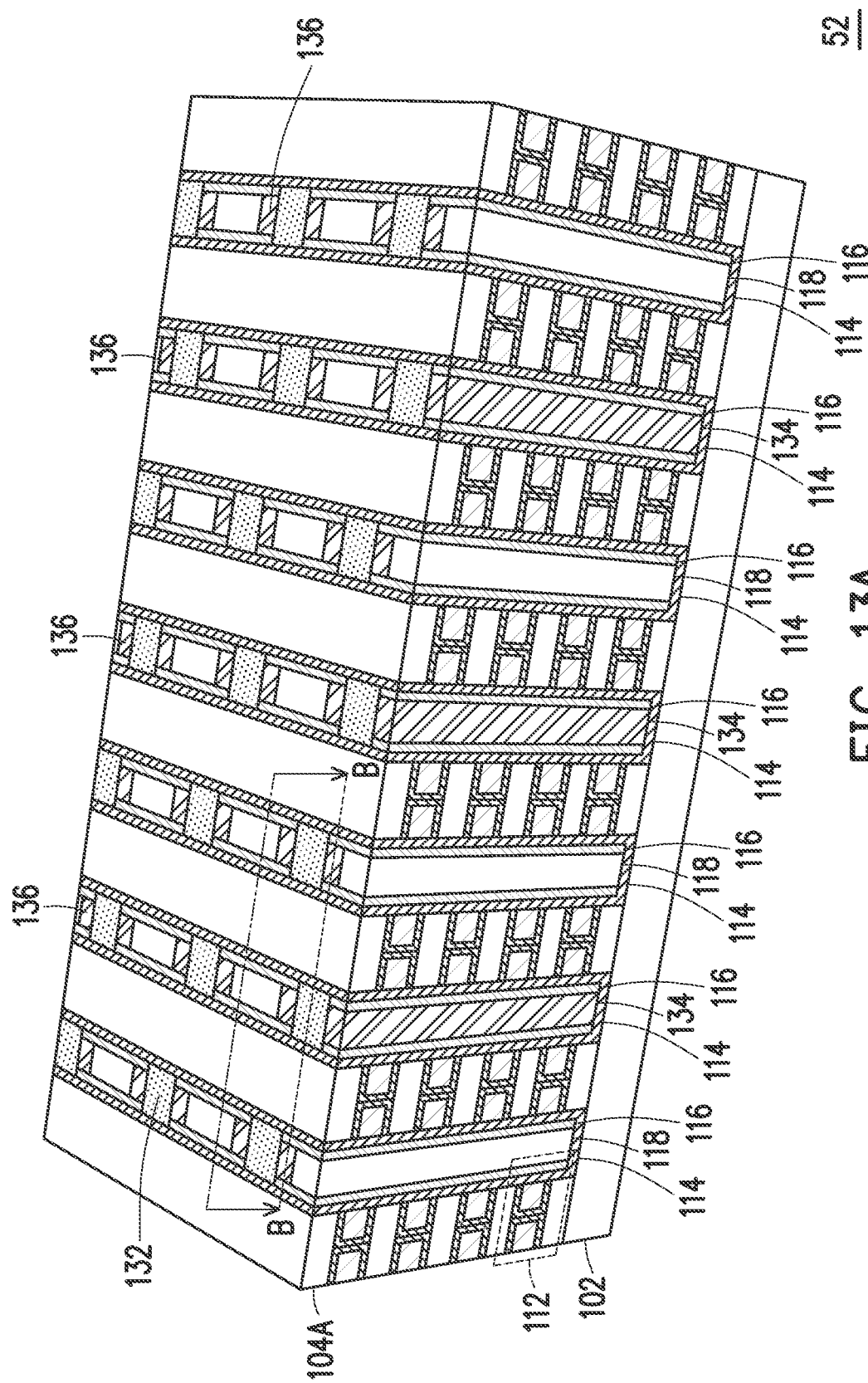
Figure 13B:
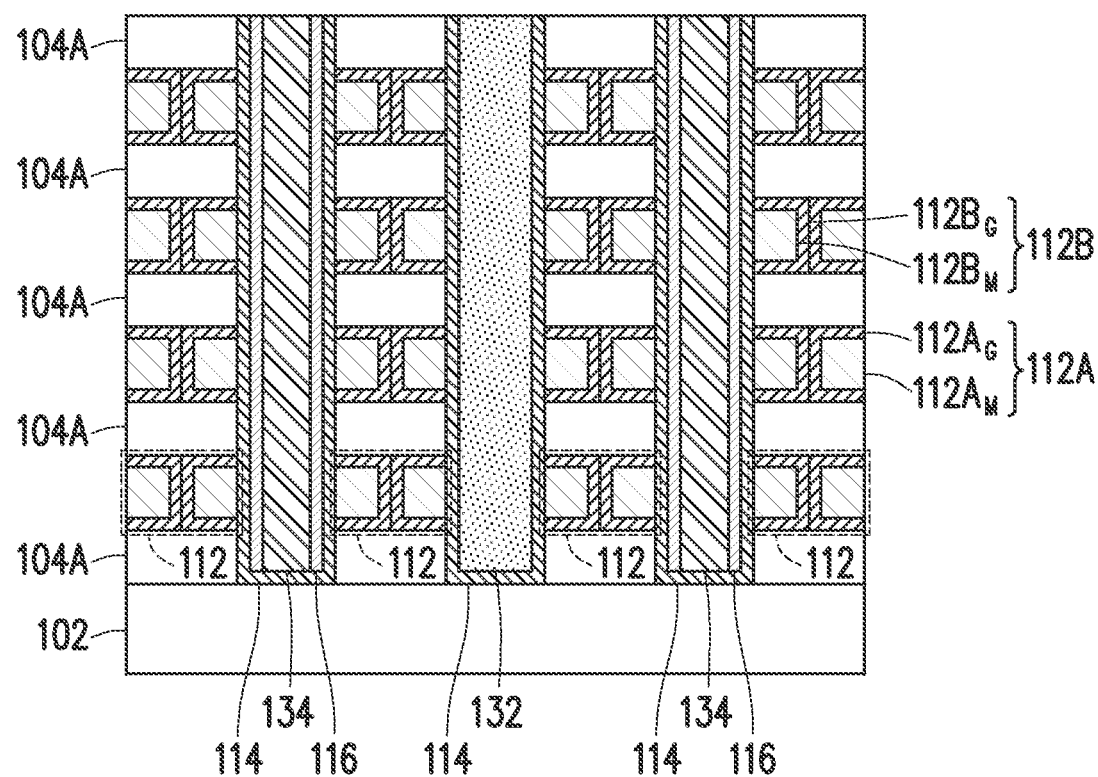

In FIGS. 13A and 13B, bit lines 134 and source lines 136 are formed through the dielectric layers 118. The bit lines 134 and the source lines 136 further extend through the first dielectric layers 104A and any remaining portions of the second dielectric layers 104B. The bit lines 134 and the source lines 136 act as source/drain regions of the TFTs. The bit lines 134 and the source lines 136 are conductive columns that are formed in pairs, with each semiconductor strip 116 contacting a corresponding bit line 134 and a corresponding source line 136. Each TFT comprises a bit line 134, a source line 136, a word line 112, and the regions of the semiconductor strip 116 and the ferroelectric strip 114 intersecting the word line 112. Each dielectric plug 132 is disposed between a bit line 134 of a TFT and a source line 136 of another TFT. In other words, a bit line 134 and a source line 136 are disposed at opposing sides of each of the dielectric plugs 132. Thus, each dielectric plug 132 physically and electrically separates adjacent TFTs.

As an example to form the bit lines 134 and the source lines 136, openings for the bit lines 134 and the source lines 136 can be formed through the dielectric layers 118. The openings may be formed using acceptable photolithography and etching techniques. Specifically, the openings are formed on opposing sides of the dielectric plugs 132. One or more conductive material(s) are then formed in the openings. Acceptable conductive materials include metals such as tungsten, cobalt, aluminum, nickel, copper, silver, gold, alloys thereof, or the like. The conductive material(s) may be formed by an acceptable deposition process such as ALD or CVD, an acceptable plating process such as electroplating or electroless plating, or the like. In some embodiments, tungsten is deposited in the openings. A planarization process is then applied to the various layers to remove excess conductive material(s) over the topmost dielectric layer 104A. The planarization process may be a chemical mechanical polish (CMP), an etch-back process, combinations thereof, or the like. The remaining conductive material(s) form the bit lines 134 and the source lines 136 in the openings. In some embodiments, the bit lines 134 and/or the source lines 136 each include a glue layer and a main layer on the glue layer. Similar to the word lines 112, the use of glue layers depends on the conductive material of the main layers.

Figure 14A:
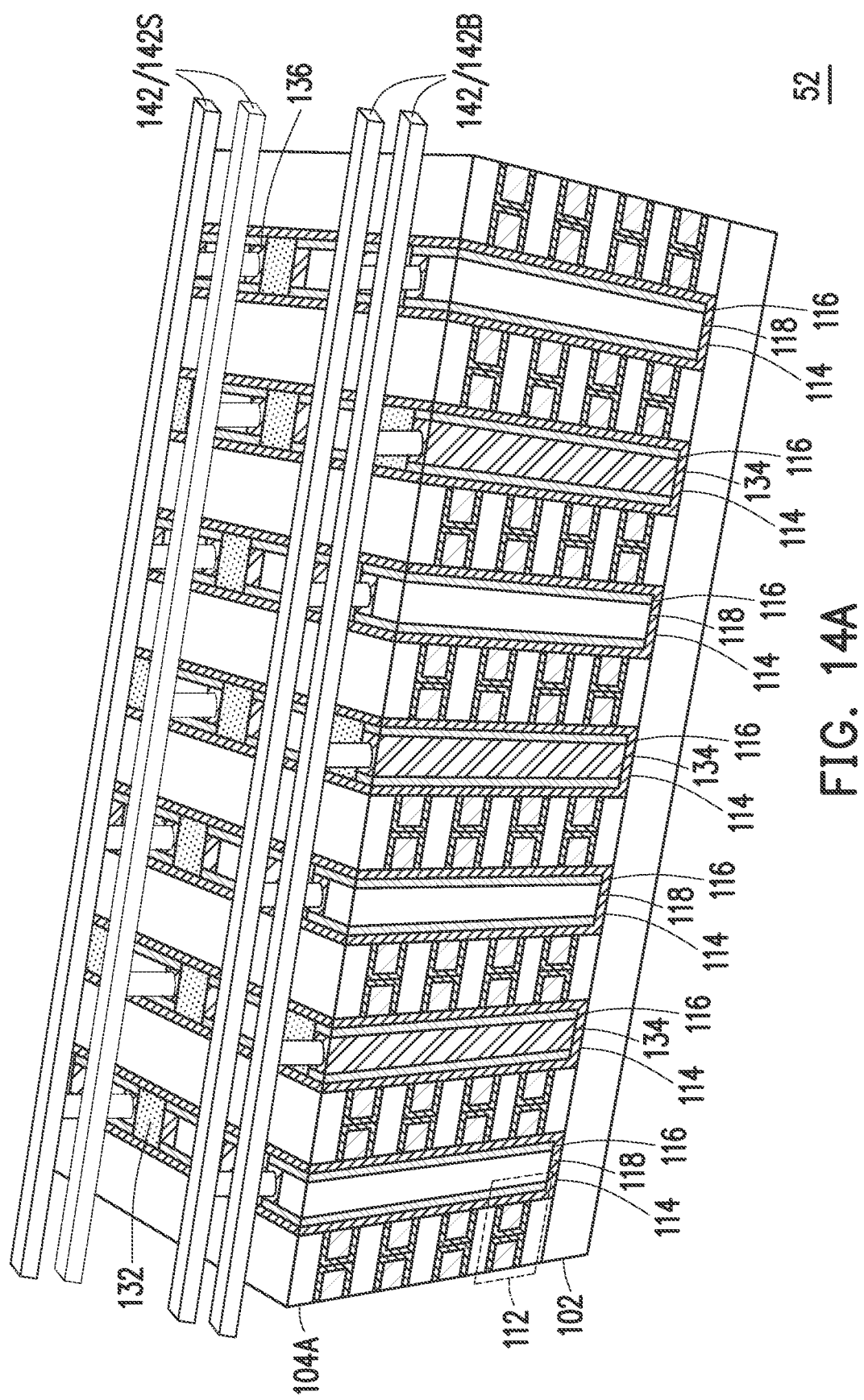
Figure 14B:
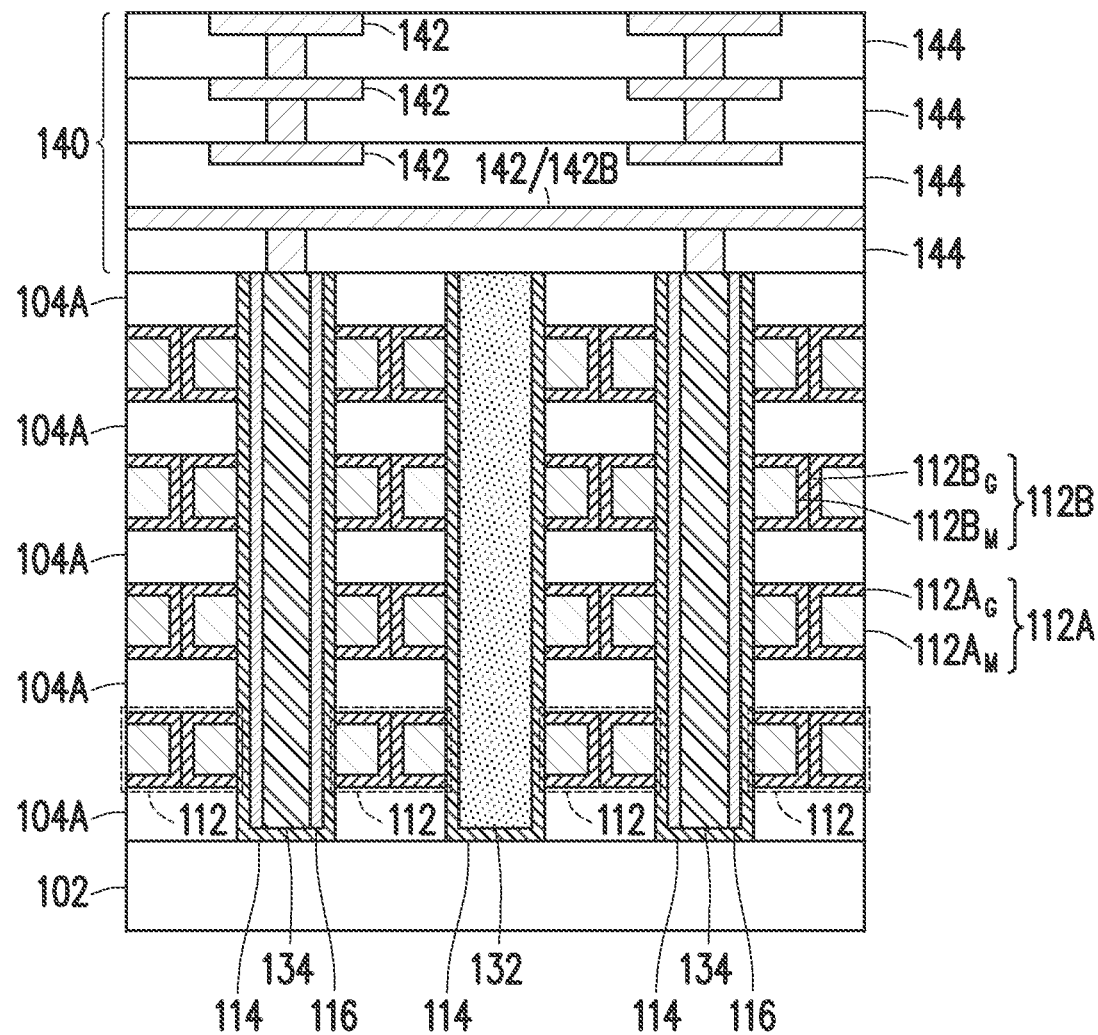

In FIGS. 14A and 14B, an interconnect structure 140 is formed over the intermediate structure. Only some features of the interconnect structure 140 are shown in FIG. 14A, for clarity of illustration. The interconnect structure 140 may include, e.g., metallization patterns 142 in a dielectric material 144. The dielectric material 144 may include one or more dielectric layers, such as one or more layers of a low-k (LK) or an extra low-K (ELK) dielectric material. The metallization patterns 142 may be metal interconnects (e.g., metal lines and vias) formed in the one or more dielectric layers. The interconnect structure 140 may be formed by a damascene process, such as a single damascene process, a dual damascene process, or the like.

The metallization patterns 142 of the interconnect structure 140 are electrically coupled to the bit lines 134 and the source lines 136. For example, the metallization patterns 142 include bit line interconnects 142B (which are electrically coupled to the bit lines 134) and source line interconnects 142S (which are electrically coupled to the source lines 136). The adjacent bit lines 134 are connected to different bit line interconnects 142B, which helps avoid shorting of the adjacent bit lines 134 when their common word line 112 is activated. Similarly, the adjacent source lines 136 are connected to different source line interconnects 142S, which helps avoid shorting of the adjacent source lines 136 when their common word line 112 is activated.

In this embodiment, the bit lines 134 and the source lines 136 are formed in a staggered layout, where adjacent bit lines 134 and adjacent source lines 136 are laterally offset from one another along the first direction $D_1$ (see FIG. 2B). Thus, each word line 112 is laterally disposed between a dielectric plug 132 and one of a bit line 134 or a source line 136. The bit line interconnects 142B and the source line interconnects 142S each extend along the second direction $D_2$ (see FIG. 2B), e.g., along the columns of the memory array 52. The bit line interconnects 142B are connected to alternating ones of the bit lines 134 along the columns of the memory array 52. The source line interconnects 142S are connected to alternating ones of the source lines 136 along the columns of the memory array 52. Laterally offsetting the bit lines 134 and the source lines 136 obviates the need for lateral interconnects along the columns of the memory array 52, thus allowing the bit line interconnects 142B and the source line interconnects 142S to be straight conductive segments that can be formed at a lowest level of the interconnect structure 140. In another embodiment (discussed below), the bit lines 134 and the source lines 136 are not formed in a staggered layout, and instead lateral interconnection is accomplished in the interconnect structure 140.

Figure 15A:
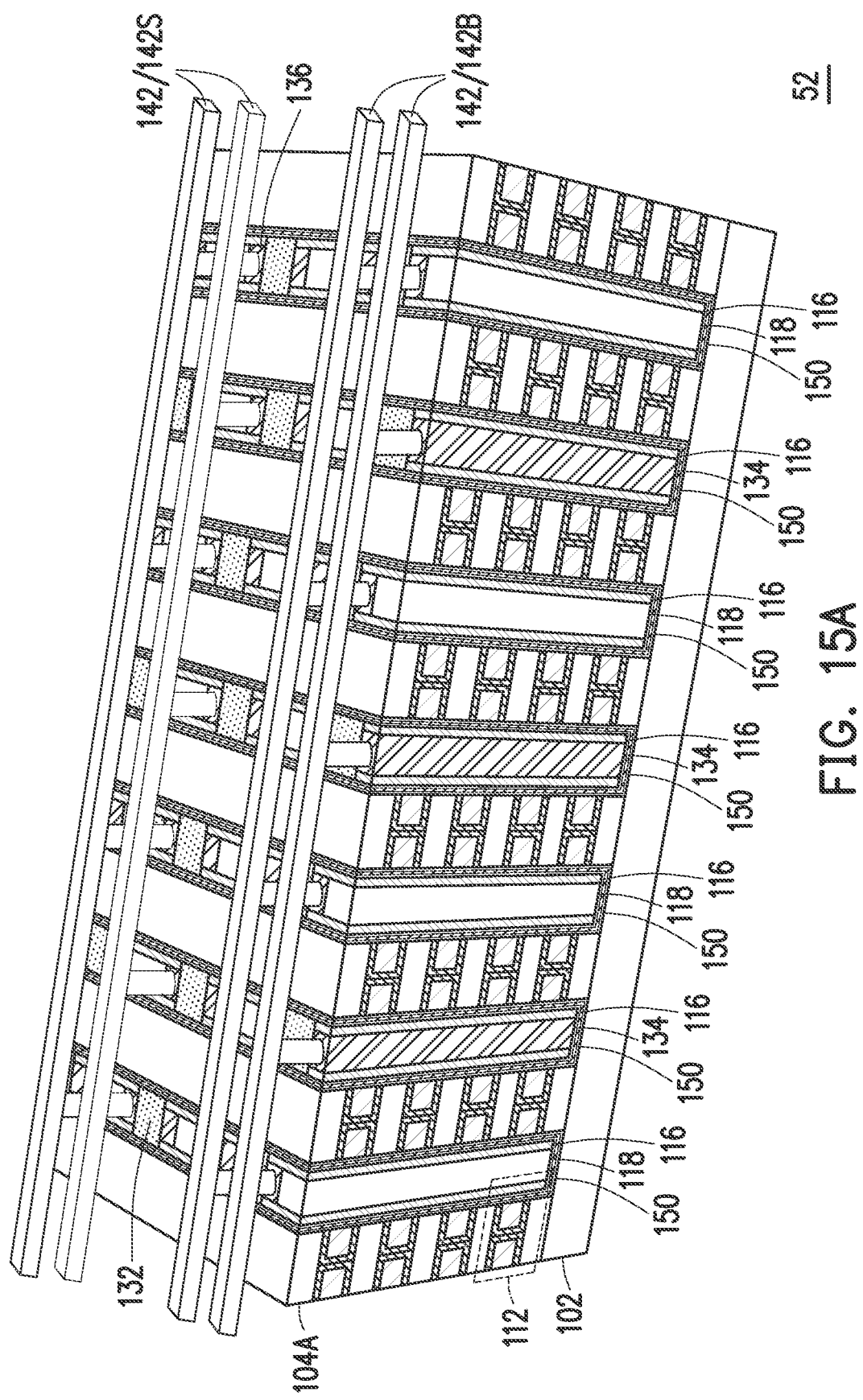
FIGS. 15A and 15B are various views of a memory array, in accordance with some other embodiments.
Figure 15B:
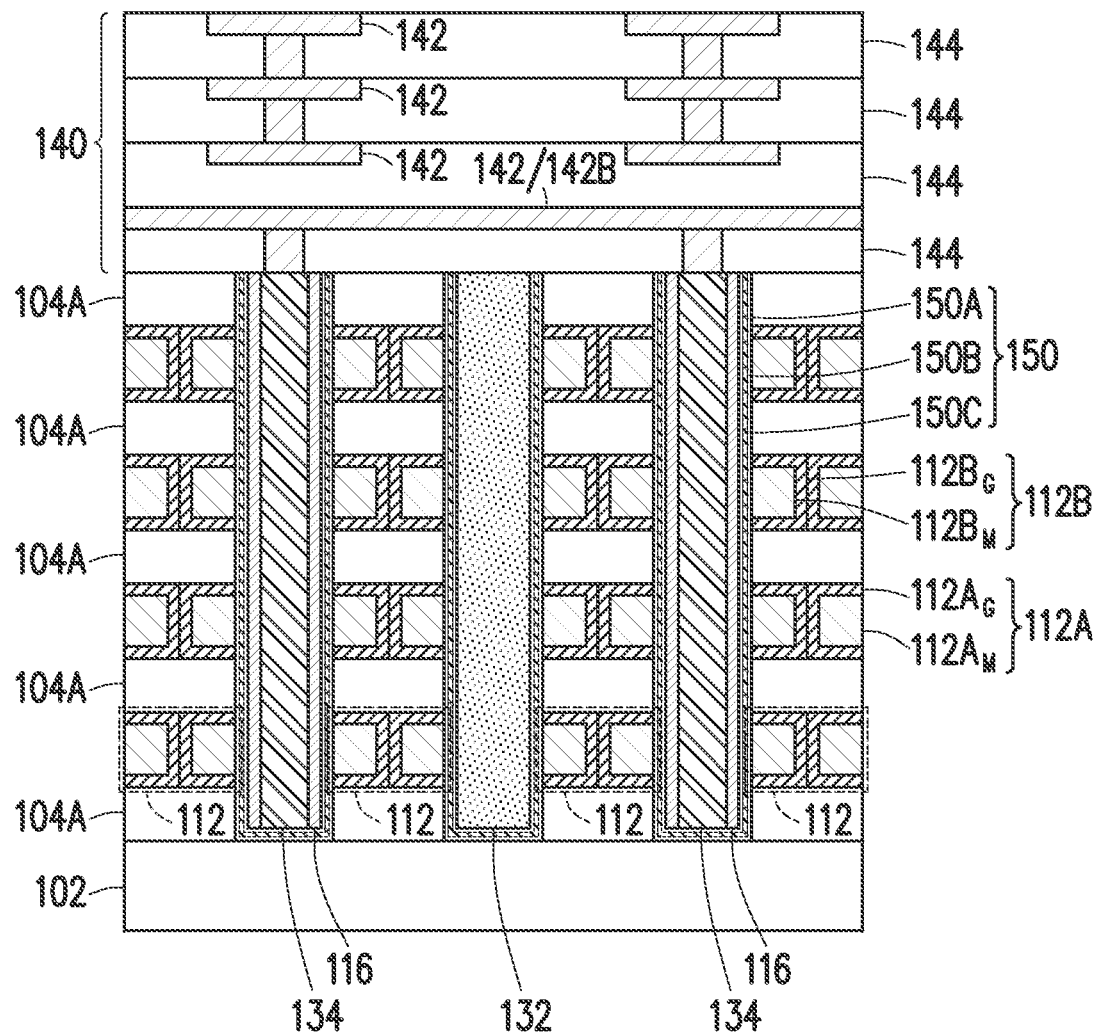

FIGS. 15A and 15B are various views of a memory array 52, in accordance with some other embodiments. A portion of the memory array 52 is illustrated. Some features, such as the staircase arrangement of the word lines (see FIG. 2B), are not shown for clarity of illustration. FIG. 15A is a three-dimensional view of the memory array 52, and FIG. 15B is a cross-sectional view showing a similar cross-section as reference cross-section B-B in FIG. 13A.

In this embodiment, the ferroelectric strips 114 are omitted and are replaced with a plurality of dielectric layers 150, which are data storage strips. Specifically, first dielectric layers 150A are formed on the substrate 102 and in contact with the sidewalls of the word lines 112. Second dielectric layers 150B are formed on the first dielectric layers 150A. Third dielectric layers 150C are formed on the second dielectric layers 150B. The first dielectric layers 150A, the second dielectric layers 150B, and the third dielectric layers 150C are each formed of dielectric materials. Acceptable dielectric materials include oxides such as silicon oxide; nitrides such as silicon nitride; carbides such as silicon carbide; the like; or combinations thereof such as silicon oxynitride, silicon oxycarbide, silicon carbonitride, or the like. In some embodiments, the first dielectric layers 150A and the third dielectric layers 150C are formed of a first dielectric material (e.g., an oxide such as silicon oxide) and the second dielectric layers 150B are formed of a different second dielectric material (e.g., a nitride such as silicon nitride). The dielectric material(s) may be formed by an acceptable deposition process such as ALD, CVD, or the like. For example, the first dielectric layers 150A, the second dielectric layers 150B, and the third dielectric layers 150C may be formed by a combination of deposition, etching, and planarization, in a similar manner as that discussed above with respect to the ferroelectric strips 114. The dielectric layers 150 may allow the TFTs to act as floating gate transistors, so that a NOR flash array is formed.

Figure 16A:
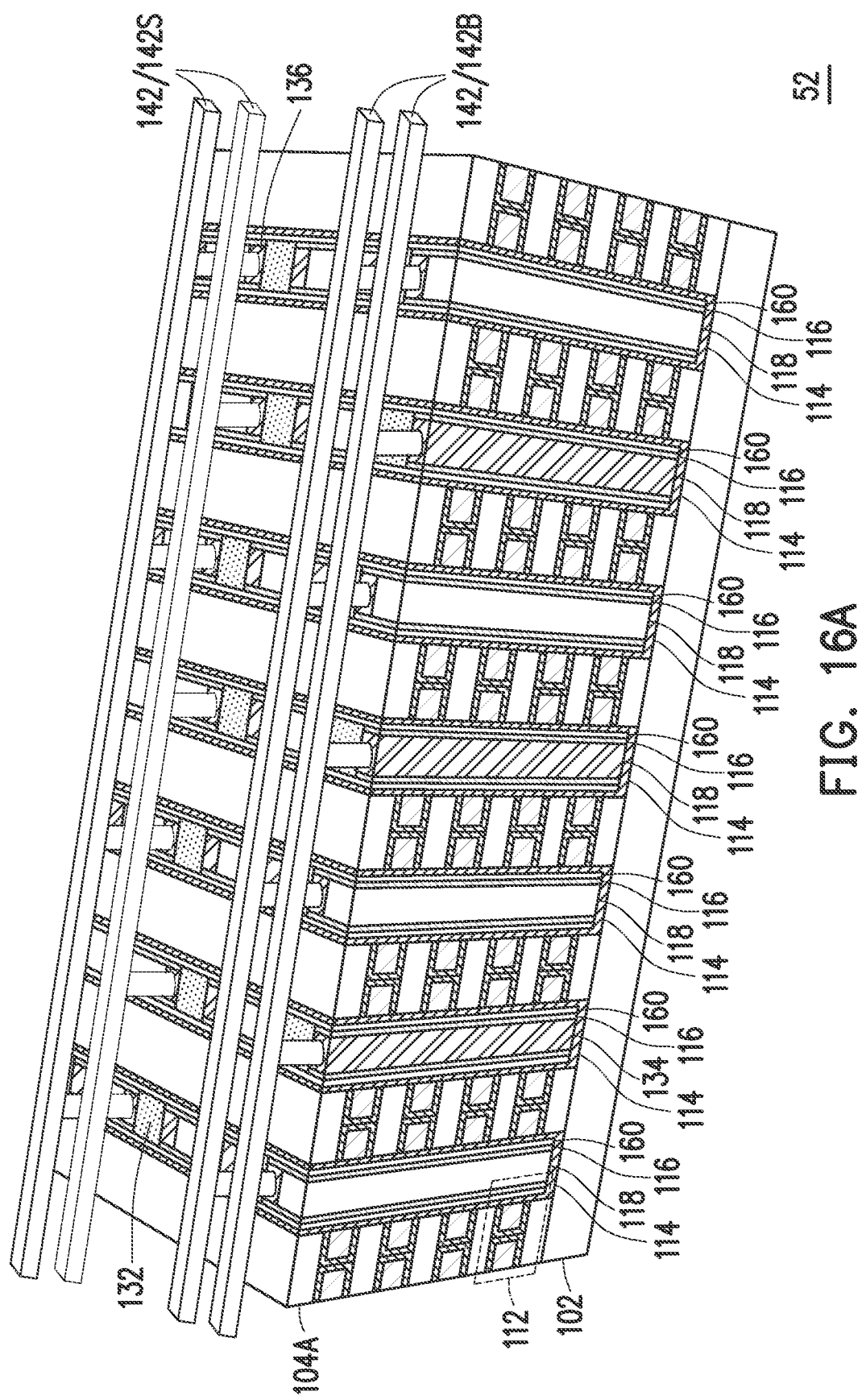
FIGS. 16A and 16B are various views of a memory array, in accordance with some other embodiments.
Figure 16B:
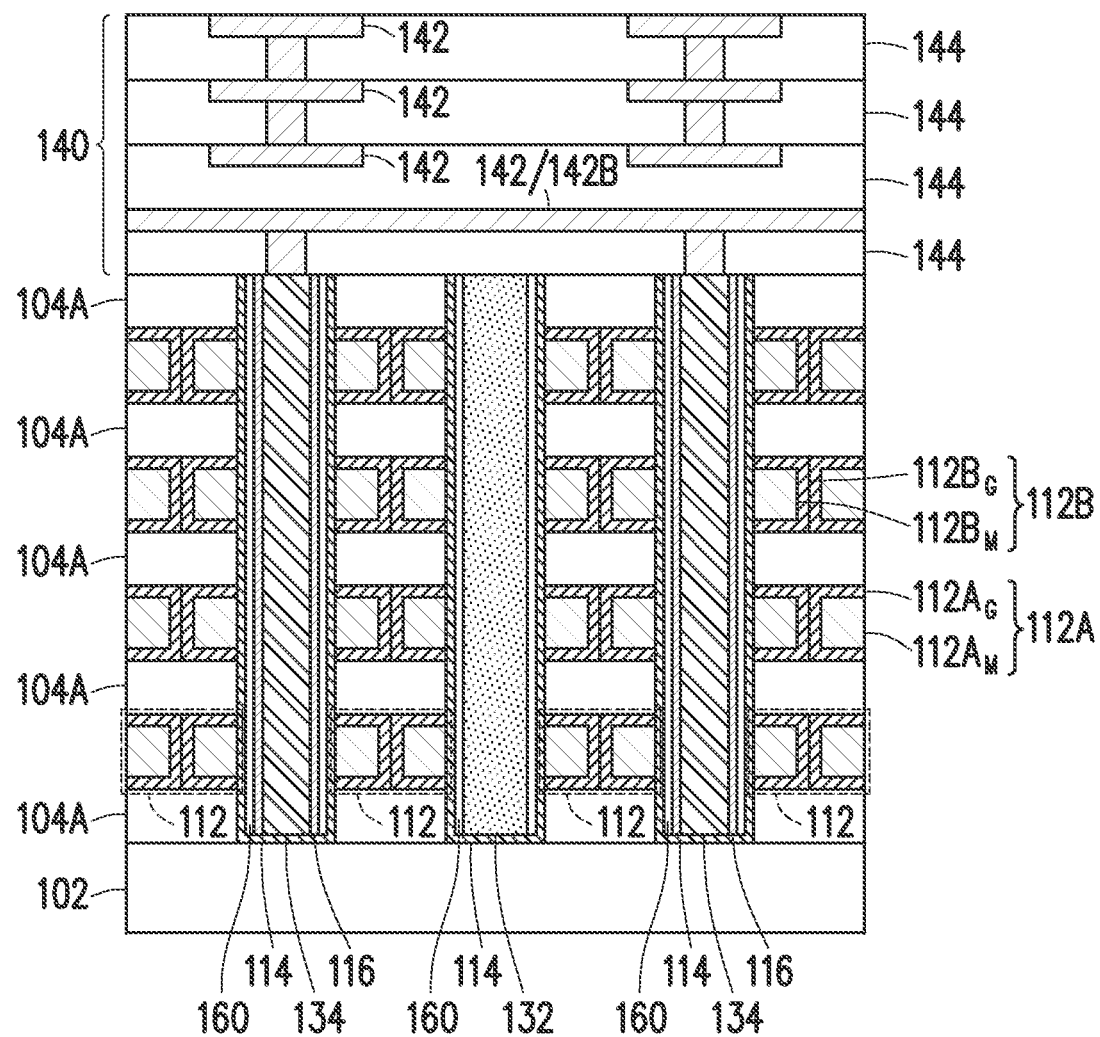

FIGS. 16A and 16B are various views of a memory array 52, in accordance with some other embodiments. A portion of the memory array 52 is illustrated. Some features, such as the staircase arrangement of the word lines (see FIG. 2B), are not shown for clarity of illustration. FIG. 16A is a three-dimensional view of the memory array 52, and FIG. 16B is a cross-sectional view showing a similar cross-section as reference cross-section B-B in FIG. 13A.

In this embodiment, conductive strips 160 are formed between the ferroelectric strips 114 and the semiconductor strips 116. Formation of the conductive strips 160 helps avoid or reduce formation of an interlayer oxide on the ferroelectric strips 114 during formation of the semiconductor strips 116. Avoiding or reducing formation of the interlayer oxide can increase the life span of the memory array 52.

The conductive strips 160 may be formed of a metal such as ruthenium, tungsten, titanium nitride, tantalum nitride, molybdenum, or the like. The conductive material(s) of the conductive strips 160 may be formed by an acceptable deposition process such as ALD or CVD, an acceptable plating process such as electroplating or electroless plating, or the like. A thickness of the conductive strips 160 can be in the range of about 1 nm to about 20 nm. The conductive strips 160 can be formed in a similar manner as the semiconductor strips 116, and can be formed during the formation of the semiconductor strips 116. The dielectric plugs 132 may (or may not) not be formed through the conductive strips 160.

Figure 17A:
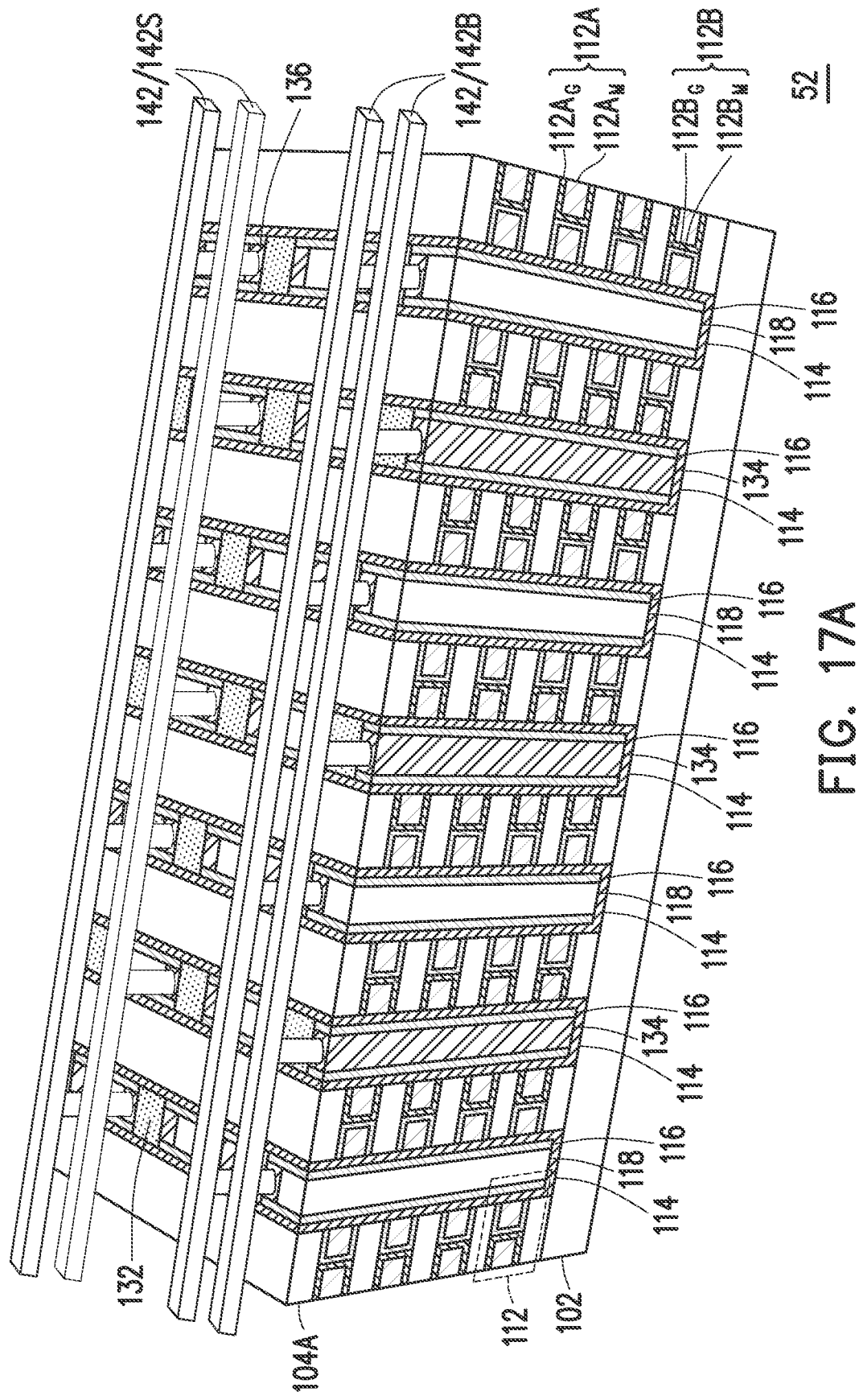
FIGS. 17A and 17B are various views of a memory array, in accordance with some other embodiments.
Figure 17B:
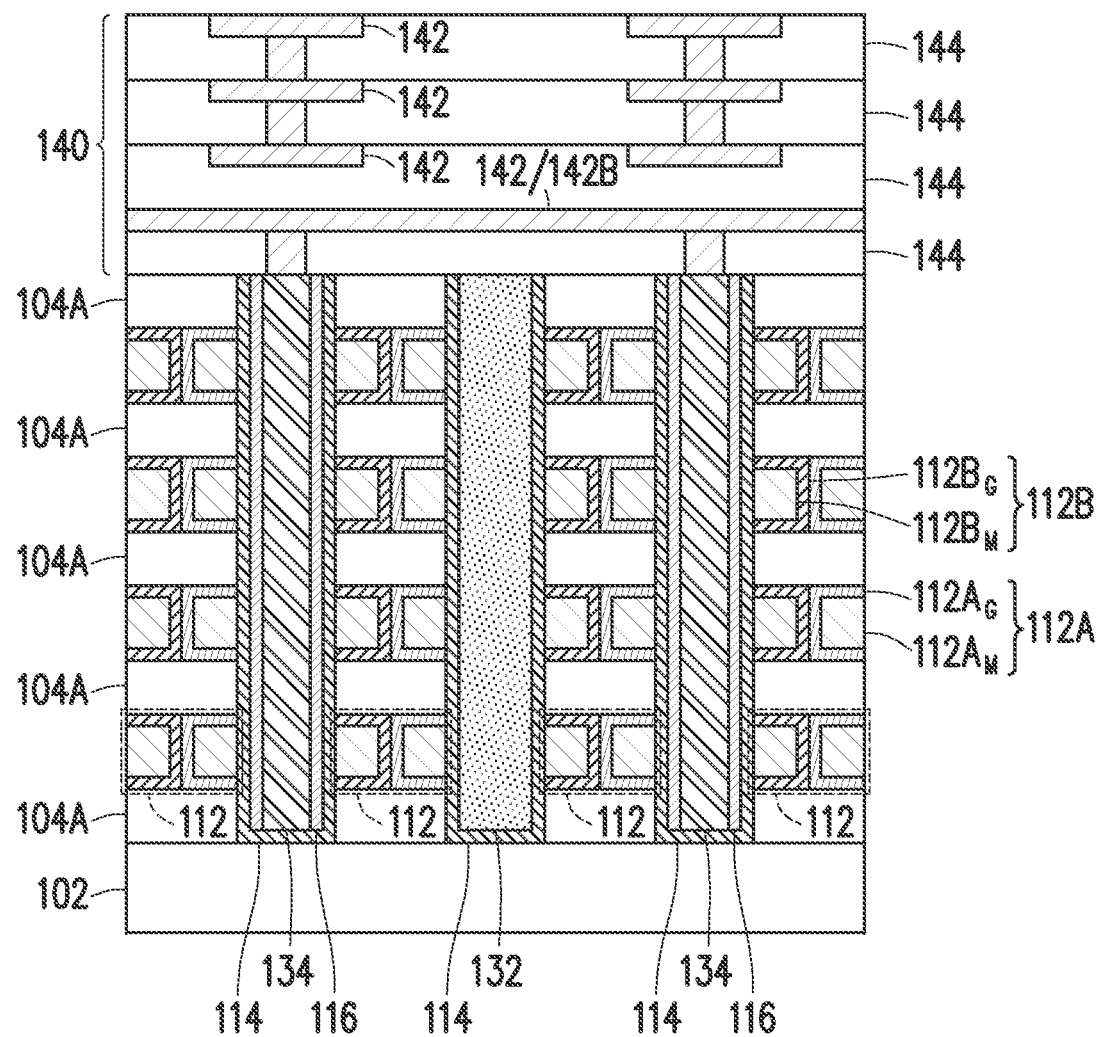

FIGS. 17A and 17B are various views of a memory array 52, in accordance with some other embodiments. A portion of the memory array 52 is illustrated. Some features, such as the staircase arrangement of the word lines (see FIG. 2B), are not shown for clarity of illustration. FIG. 17A is a three-dimensional view of the memory array 52, and FIG. 17B is a cross-sectional view showing a similar cross-section as reference cross-section B-B in FIG. 13A.

In this embodiment, the glue layers $112A_G$ and the glue layers $112B_G$ are formed of different materials. For example, the glue layers $112A_G$ can be formed of a first glue material (e.g., titanium nitride) and the glue layers $112B_G$ can be formed of a second glue material (e.g., tantalum nitride). As such, the glue layers $112A_G$ and the glue layers $112B_G$ may not merge during formation such that they are separate and distinct from each another. In some embodiments, the glue layers $112B_G$ can be formed of a material with lower resistivity than the glue layers $112A_G$, improving the performance of the word lines 112.

Figure 18A:
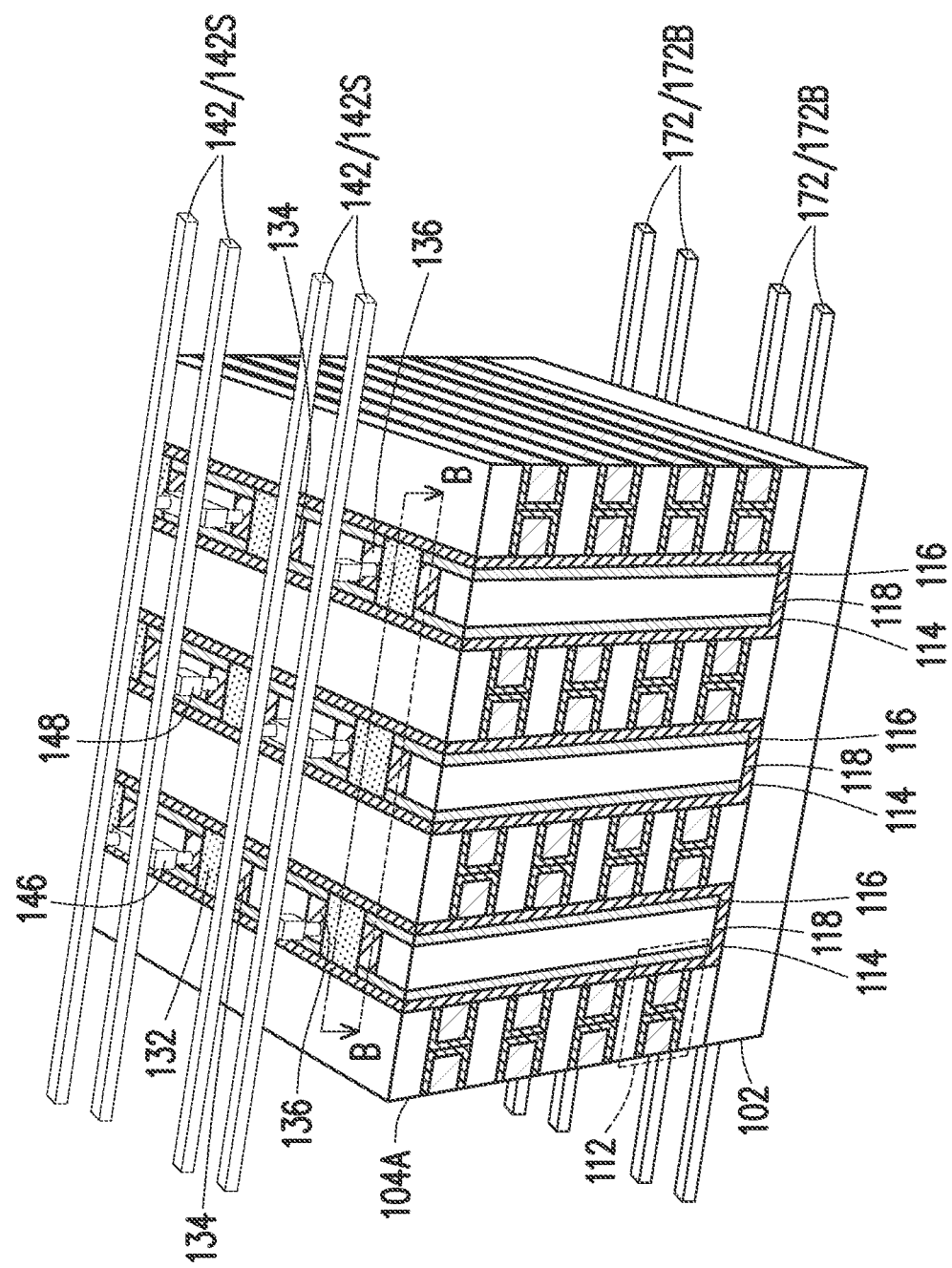
FIGS. 18A and 18B are various views of a memory array, in accordance with some other embodiments.
Figure 18B:
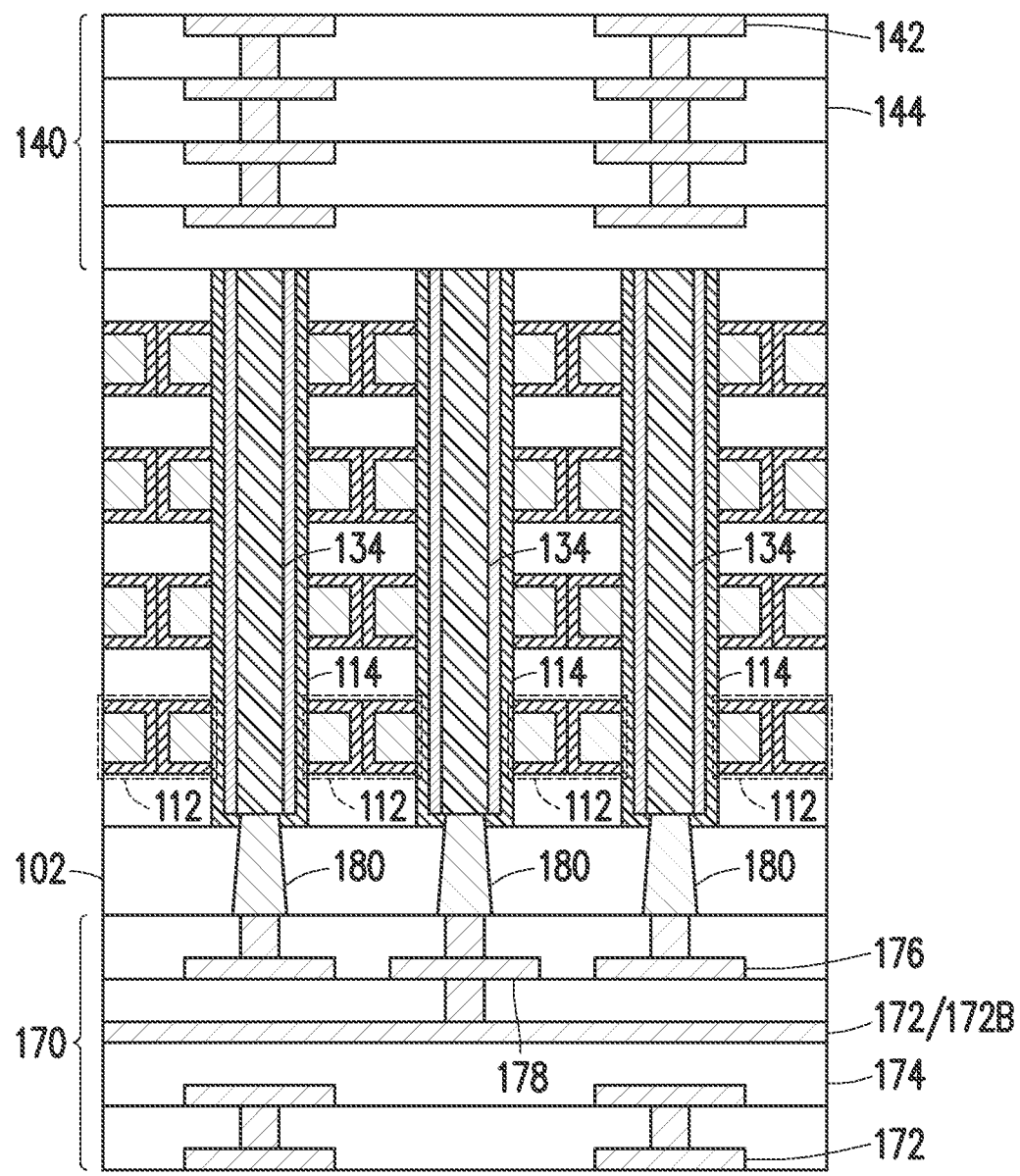

FIGS. 18A and 18B are various views of a memory array 52, in accordance with some other embodiments. A portion of the memory array 52 is illustrated. Some features, such as the staircase arrangement of the word lines (see FIG. 2B), are not shown for clarity of illustration. FIG. 18A is a three-dimensional view of the memory array 52, and FIG. 18B is a cross-sectional view shown along reference cross-section B-B in FIG. 18A.

In this embodiment, the metallization patterns 142 of the interconnect structure 140 only include source line interconnects 142S. Another interconnect structure 170 is formed at an opposite side of the substrate 102 from the interconnect structure 140. The interconnect structure 170 may be formed in a similar manner as the interconnect structure 140. The interconnect structure 170 may include, e.g., metallization patterns 172 in a dielectric material 174. Conductive vias 180 can be formed through the substrate 102 and the ferroelectric strips 114 to electrically couple the metallization patterns 172 to the bit lines 134 and/or the source lines 136. For example, the metallization patterns 172 include bit line interconnects 172B (which are electrically coupled to the source lines 136 by the conductive vias 180).

Further, in this embodiment, the bit lines 134 and the source lines 136 are not formed in a staggered layout, and thus adjacent bit lines 134 and adjacent source lines 136 are laterally aligned with one another along the first direction $D_1$ (see FIG. 2B). Thus, each word line 112 is laterally disposed between a pair of bit lines 134 or a pair of source lines 136. Because the bit lines 134 and the source lines 136 are not formed in a staggered layout, lateral interconnection to a subset of the source line interconnects 142S is accomplished in the interconnect structure 140, and lateral interconnection to a subset of the bit line interconnects 172B is accomplished in the interconnect structure 170. For example, the source line interconnects 142S are straight conductive segments that are formed at an intermediate level of the interconnect structure 140. Lateral interconnects 146 between a first subset of the source line interconnects 142S and the source lines 136 are formed at a lower level of the interconnect structure 140 than the source line interconnects 142S. Straight interconnects 148 between a second subset of the source line interconnects 142S and the source lines 136 are formed at a lower level of the interconnect structure 140 than the source line interconnects 142S. Similarly, the bit line interconnects 172B are straight conductive segments that are formed at an intermediate level of the interconnect structure 170. Lateral interconnects 176 between a first subset of the bit line interconnects 172B and the bit lines 134 are formed at a lower level of the interconnect structure 170 than the bit line interconnects 172B. Straight interconnects 178 between a second subset of the bit line interconnects 172B and the bit lines 134 are formed at a lower level of the interconnect structure 140 than the bit line interconnects 172B.

It should be appreciated that the layouts of the interconnect structures 140, 170 may be flipped in other embodiments. For example, the metallization patterns 142 of the interconnect structure 140 can include bit line interconnects, and the metallization patterns 172 of the interconnect structure 170 can include source line interconnects.

Figure 19A:
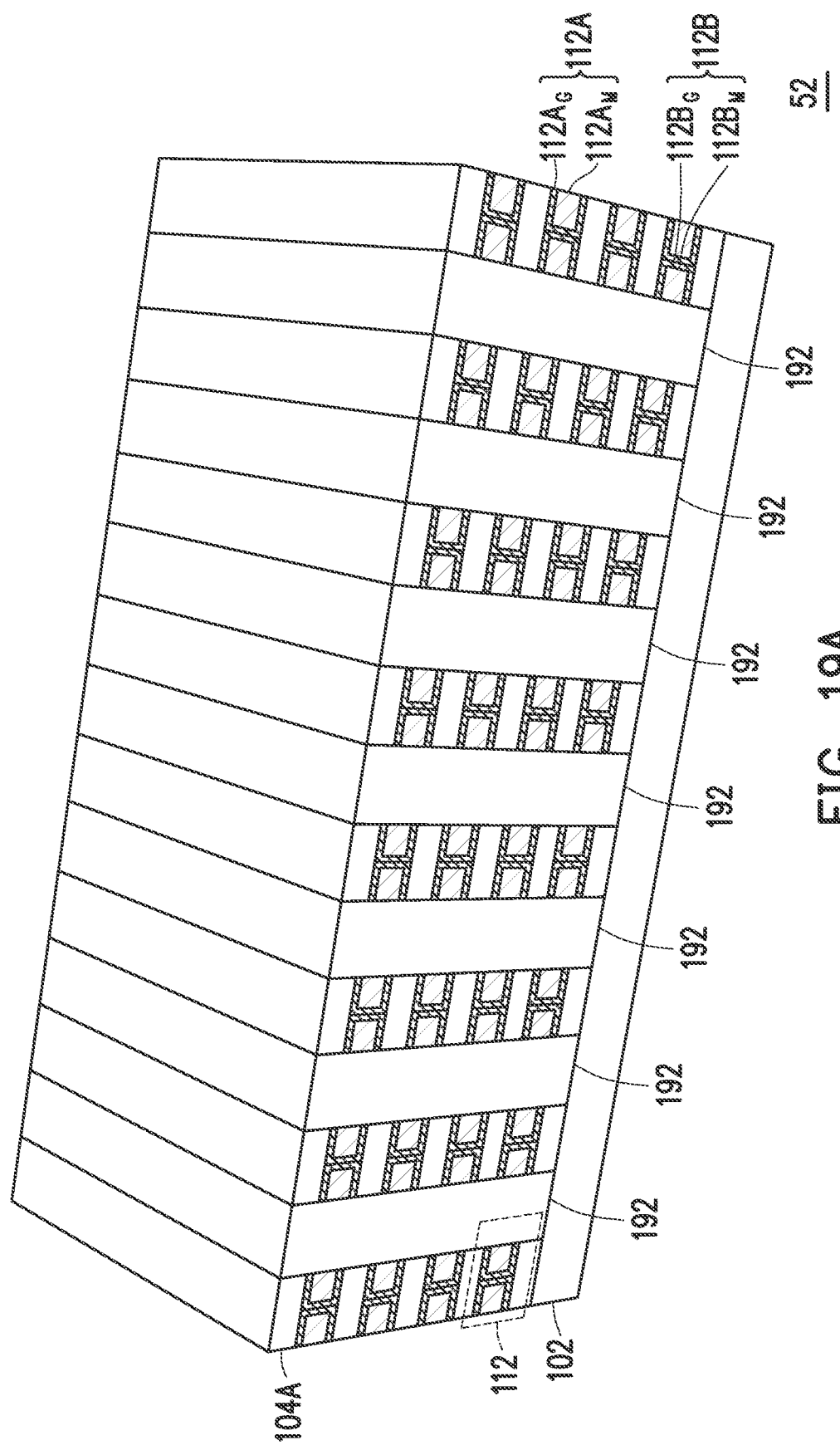
FIGS. 19A through 21B are various views of intermediate stages in the manufacturing of a memory array, in accordance with some other embodiments.
Figure 19B:
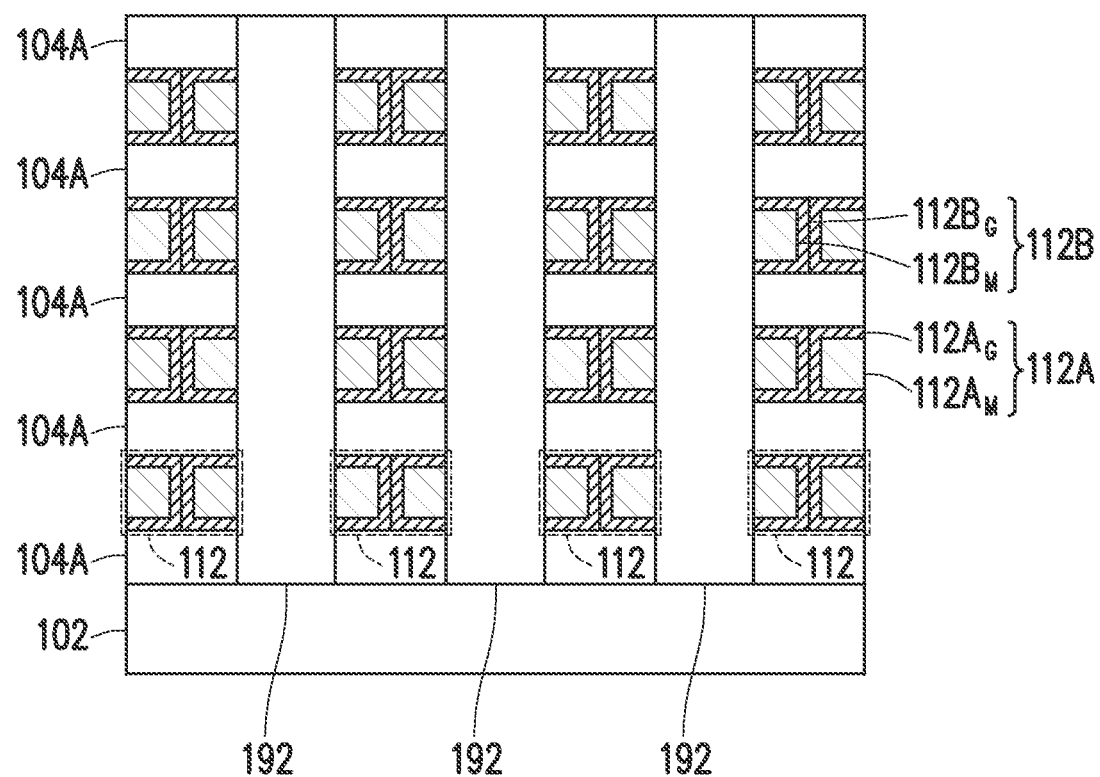
Figure 20A:
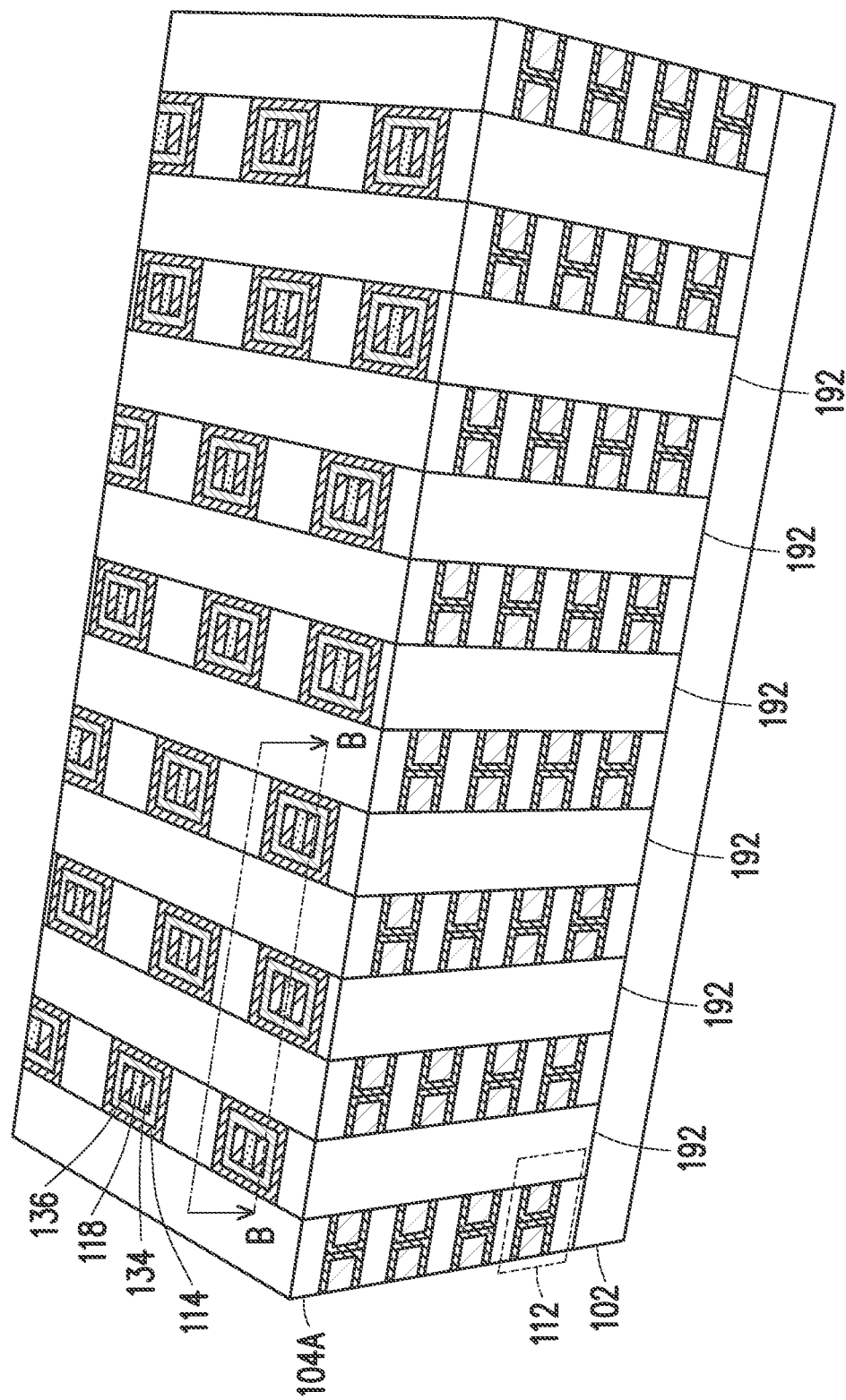
Figure 20B:
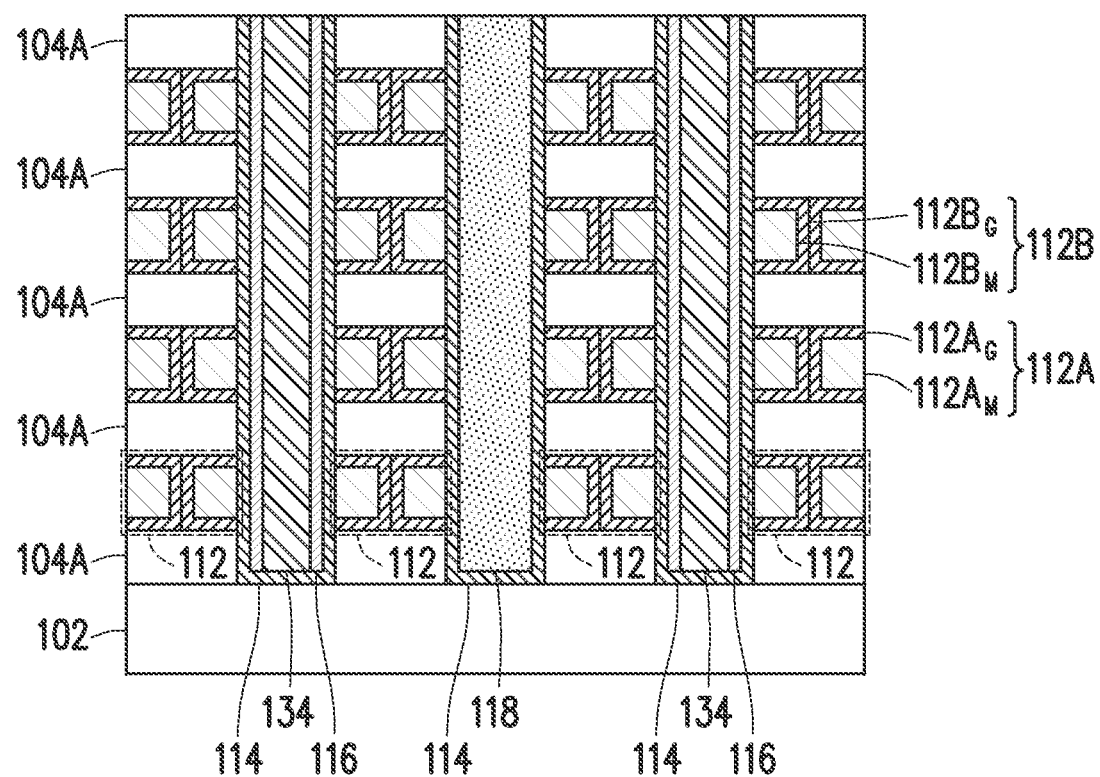
Figure 21A:
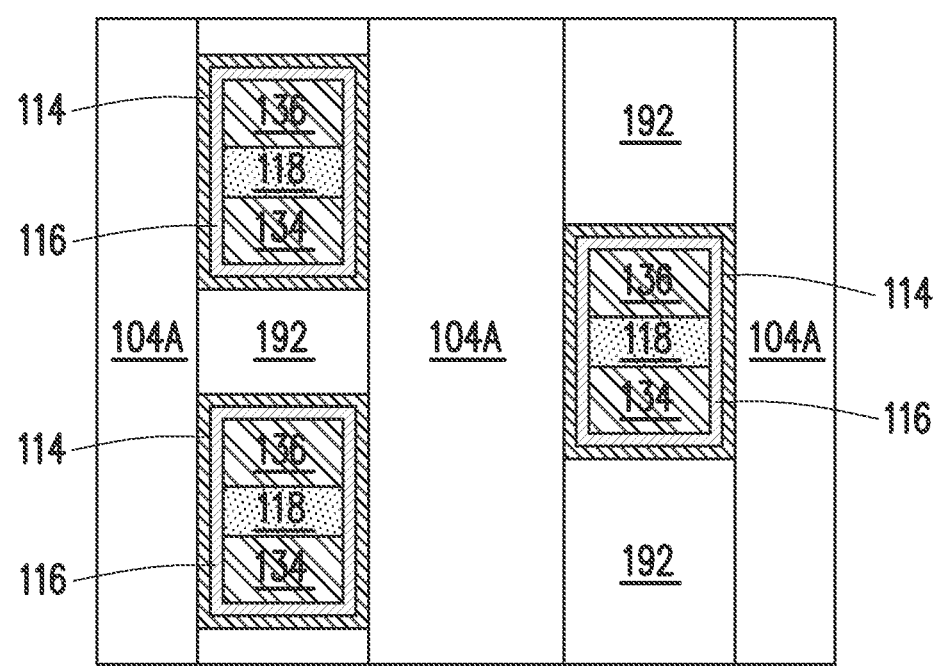
Figure 21B:
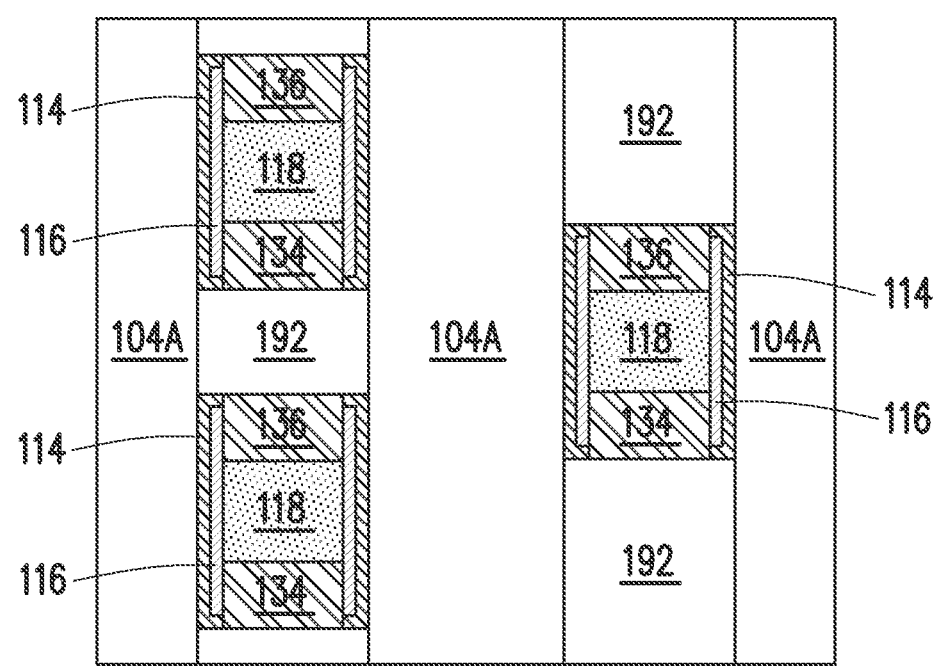

FIGS. 19A through 21B are various views of intermediate stages in the manufacturing of a memory array 52, in accordance with some other embodiments. A portion of the memory array 52 is illustrated. Some features, such as the staircase arrangement of the word lines (see FIG. 2B), are not shown for clarity of illustration. FIGS. 19A and 20A are three-dimensional views of the memory array 52. FIGS. 19B and 20B are a cross-sectional views shown along reference cross-section B-B in FIG. 20A. FIGS. 21A and 21B are top-down views of a portion of the memory array 52.

In FIGS. 19A and 19B, a structure similar to that described with respect to FIGS. 11A and 11B is obtained, however, the ferroelectric strips 114, the semiconductor strips 116, and the dielectric layers 118 are not formed at this step of processing. Instead, the first trenches 106 (see FIGS. 4A and 4B) and the second trenches 120 (see FIGS. 8A and 8B) are each filled with a dielectric layer 192. The dielectric layers 192 are formed of a dielectric material. Acceptable dielectric materials include oxides such as silicon oxide; nitrides such as silicon nitride; carbides such as silicon carbide; the like; or combinations thereof such as silicon oxynitride, silicon oxycarbide, silicon carbonitride, or the like. The dielectric material(s) may be formed by an acceptable deposition process such as ALD, CVD, or the like. In some embodiments, silicon oxide is deposited in the first trenches 106 and the second trenches 120. Planarization processes may be applied to the various layers to remove excess dielectric materials over the topmost dielectric layer 104A. The planarization process may be a chemical mechanical polish (CMP), an etch-back process, combinations thereof, or the like. For example, a first planarization processes can be performed after the first trenches 106 are filled to form the dielectric layers 192, and second planarization processes can be performed after the second trenches 120 are filled to form the dielectric layers 192.

In FIGS. 20A and 20B, TFT film stacks are formed extending through the dielectric layers 192. The TFT film stacks each include a ferroelectric strip 114, a semiconductor strip 116, and a dielectric layer 118. Bit lines 134 and source lines 136 are then formed through at least the dielectric layers 118.

The ferroelectric strips 114, the semiconductor strips 116, and the dielectric layers 118 may be formed by a combination of deposition, etching, and planarization. For example, openings can be formed through the dielectric layers 192. The openings may be formed using acceptable photolithography and etching techniques. A ferroelectric layer can be conformally deposited in the openings through the dielectric layers 192. A semiconductor layer can then be conformally deposited on the ferroelectric layer. The semiconductor layer can then be anisotropically etched to remove horizontal portions of the semiconductor layer, thus exposing the ferroelectric layer. A dielectric layer can then be conformally deposited on the remaining vertical portions of the semiconductor layer and the exposed portions of the ferroelectric layer. A planarization process is then applied to the various layers to remove excess materials over the topmost dielectric layer 104A. The planarization process may be a chemical mechanical polish (CMP), an etch-back process, combinations thereof, or the like. The portions of the ferroelectric layer, the semiconductor layer, and the dielectric layer remaining in the openings through the dielectric layers 192 form the ferroelectric strips 114, the semiconductor strips 116, and the dielectric layers 118, respectively. The planarization process exposes the topmost dielectric layer 104A such that top surfaces of the topmost dielectric layer 104A, the ferroelectric strips 114, the semiconductor strips 116, and the dielectric layers 118 are coplanar (within process variations) after the planarization process.

As an example to form the bit lines 134 and the source lines 136, openings for the bit lines 134 and the source lines 136 can be formed through the dielectric layers 118, and optionally also the ferroelectric strips 114 and the semiconductor strips 116. The openings may be formed using acceptable photolithography and etching techniques. Specifically, the openings are formed so that they oppose the sides of the remaining portions of the dielectric layers 118. In some embodiments, the openings only extend through the dielectric layers 118, so that the bit lines 134 and the source lines 136 only replace portions of the dielectric layers 118 (as shown by FIGS. 20A and 21A). In some embodiments, the openings also extend through the ferroelectric strips 114 and the semiconductor strips 116, so that the bit lines 134 and the source lines 136 also replace portions of the ferroelectric strips 114 and the semiconductor strips 116 (as shown by FIG. 21B). One or more conductive material(s) are then formed in the openings. Acceptable conductive materials include metals such as tungsten, cobalt, aluminum, nickel, copper, silver, gold, alloys thereof, or the like. The conductive material(s) may be formed by an acceptable deposition process such as ALD or CVD, an acceptable plating process such as electroplating or electroless plating, or the like. In some embodiments, tungsten is deposited in the openings. A planarization process is then applied to the various layers to remove excess conductive material(s) over the topmost dielectric layer 104A. The planarization process may be a chemical mechanical polish (CMP), an etch-back process, combinations thereof, or the like. The remaining conductive material(s) form the bit lines 134 and the source lines 136 in the openings. Interconnects may then be formed over (or under) the bit lines 134 and the source lines 136, using similar techniques as those discussed above, so that the bit lines 134 and the source lines 136 may be coupled to bit line interconnects and source lines interconnects, respectively.

In the embodiments described with respect to FIGS. 3A through 21B, the memory array 52 is formed over a substrate 50, such as a dielectric substrate. In some embodiments, the memory array 52 is formed as part of a standalone device (e.g., a memory die), which is integrated with other devices (e.g., a logic die) through device packaging. In some embodiments, the memory array 52 is embedded in another device, such as a logic die. In such embodiments, the substrate 50 may be omitted, or may be an underlying layer.

Figure 22:
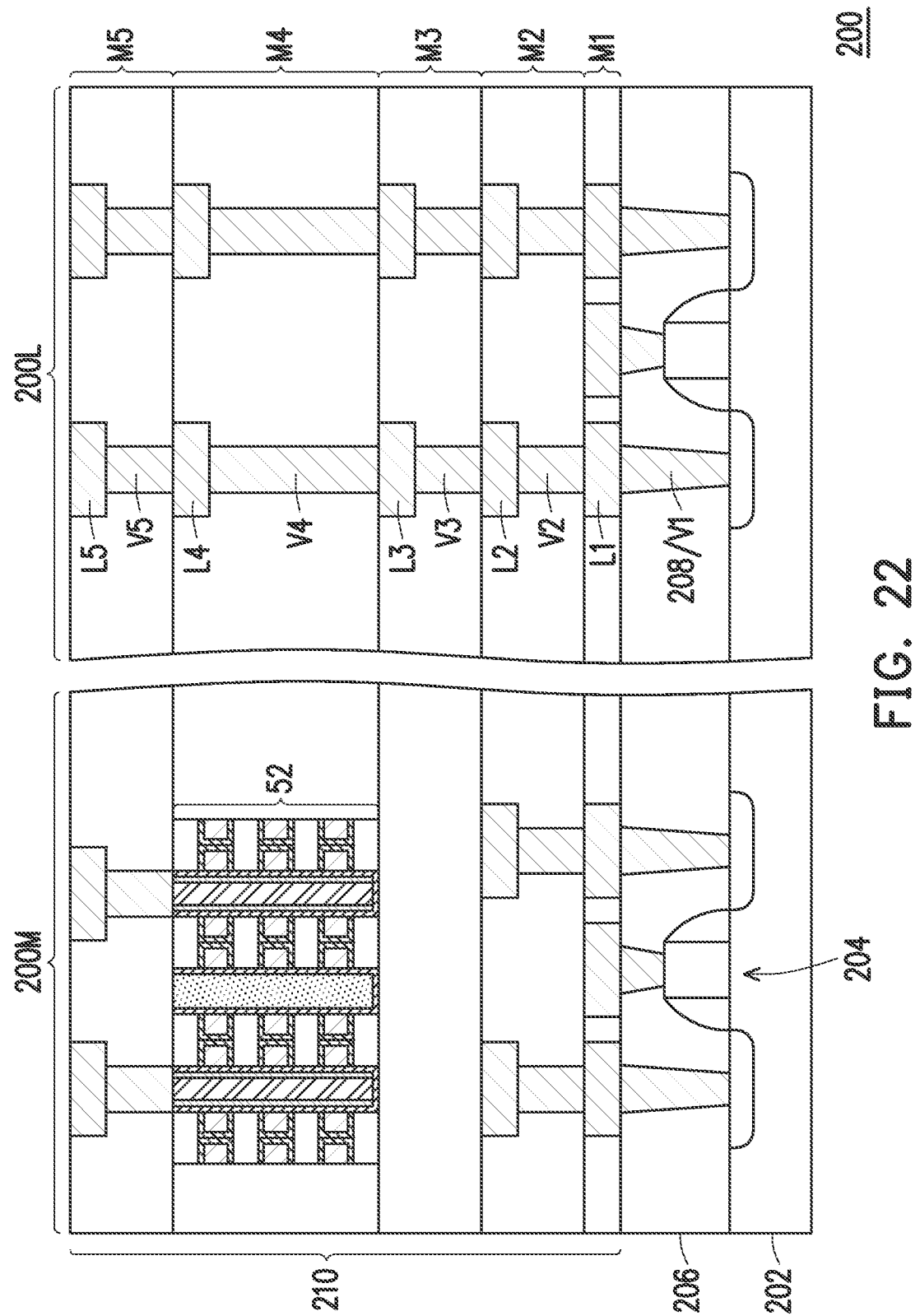
FIG. 22 is a cross-sectional view of a semiconductor device, in accordance with some embodiments.

FIG. 22 is a cross-sectional view of a semiconductor device 200, in accordance with some embodiments. FIG. 22 is a simplified view, and some features are omitted for clarity of illustration. The semiconductor device 200 includes a logic region 200L and a memory region 200M. Memory devices (e.g., flash memories) are formed in the memory region 200M and logic devices (e.g., logic circuits) are formed in the logic region 200L. For example, a memory array 52 (see FIG. 1) can be formed in the memory region 200M, and the row decoder 54 and column decoder 56 (see FIG. 1) can be formed in the logic region 200L. The memory region 200M can be disposed at an edge of the logic region 200L, or the logic region 200L can surround the memory region 200M.

The logic region 200L and the memory region 200M are formed over a same semiconductor substrate 202. The semiconductor substrate 202 may be silicon, doped or undoped, or an active layer of a semiconductor-on-insulator (SOI) substrate. The semiconductor substrate 202 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 204 are formed at the active surface of the semiconductor substrate 202. The devices 204 may be active devices or passive devices. For example, the electrical components may be transistors, diodes, capacitors, resistors, or the like, formed by any suitable formation method. The devices 204 are interconnected to form the memory devices and logic devices of the semiconductor device 200.

One or more inter-layer dielectric (ILD) layer(s) 206 are formed on the semiconductor substrate 202, and electrically conductive features, such as contact plugs 208, are formed electrically connected to the devices 204. The ILD layer(s) 206 may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The ILD layer(s) may be formed by any acceptable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 210 is formed over the semiconductor substrate 202. The interconnect structure 210 interconnects the devices 204 to form integrated circuits in each of the logic region 200L and memory region 200M. The interconnect structure 210 includes multiple metallization layers M1-M5. Although five metallization layers are illustrated, it should be appreciated that more or less metallization layers may be included. Each of the metallization layers M1-M5 includes metallization patterns in dielectric layers. The metallization patterns are electrically coupled to the devices 204 of the semiconductor substrate 202, and include, respectively, metal lines L1-L5 and metal vias V1-V5 formed in one or more inter-metal dielectric (IMD) layers. The interconnect structure 210 may formed by a damascene process, such as a single damascene process, a dual damascene process, or the like. In some embodiments, the contact plugs 208 are also part of the metallization patterns, such as part of the lowest layer of metal vias V1.

The memory array 52 is formed in the interconnect structure 210. The memory array 52 can be formed in any of the metallization layers M1-M5, and is illustrated as being formed in an intermediate metallization layer M4, although it could also be formed in a bottom metallization layer M1 or an upper metallization layer M5. The memory array 52 is electrically connected to the devices 204. For example, a metallization layer overlying the memory array 52 (e.g., the metallization layer M5) may contain source line interconnects and the bit line interconnects that are electrically connected to the TFTs of the memory array 52 and to the devices 204.

In some embodiments, the interconnect structure 210 may be formed by first forming the layers underlying the memory array 52, e.g., the metallization layers M1-M3. The memory array 52 can then be formed on the metallization layer M3, with the IMD of the metallization layer M3 acting as the substrate 50 (see FIG. 3). After formation of the memory array 52, the remainder of the metallization layer M4 can be formed, such as by depositing and planarizing the IMD for the metallization layer M4, and then forming metal lines M4 and metal vias M4. The layers overlying the memory array 52, e.g., the metallization layer M5, can then be formed.

Embodiments may achieve advantages. Forming the word lines 112 by a multiple-patterning process allows the multilayer stack 104 to be patterned with different patterns of a low pattern density. The word lines 112 can thus be formed in portions (e.g., the first conductive features 112A and the second conductive features 112B), and twisting or collapsing of the multilayer stack 104 may be avoided during the formation of each portion of the word lines 112.

In an embodiment, a method includes: etching a first trench in a multilayer stack, the multilayer stack including alternating dielectric layers and sacrificial layers; replacing first portions of the sacrificial layers exposed by the first trench with first conductive features; forming a first data storage strip and a first semiconductor strip in the first trench; after forming the first data storage strip and the first semiconductor strip, etching a second trench in the multilayer stack; replacing second portions of the sacrificial layers exposed by the second trench with second conductive features; and forming a second data storage strip and a second semiconductor strip in the second trench.

In some embodiments, the method further includes: depositing a first dielectric layer in the first trench, the first semiconductor strip disposed between the first dielectric layer and the first data storage strip; and depositing a second dielectric layer in the second trench, the second semiconductor strip disposed between the second dielectric layer and the second data storage strip. In some embodiments, the method further includes: forming a first dielectric plug and a second dielectric plug, the first dielectric plug extending through the first dielectric layer and the first semiconductor strip, the second dielectric plug extending through the second dielectric layer and the second semiconductor strip; forming a first bit line and a second bit line, the first bit line extending through the first dielectric layer, the second bit line extending through the second dielectric layer; and forming a first source line and a second source line, the first source line extending through the first dielectric layer, the second source line extending through the second dielectric layer, the first dielectric plug disposed between the first source line and the first bit line, the second dielectric plug disposed between the second source line and the second bit line. In some embodiments of the method, the first data storage strip contacts each of the first conductive features, and the second data storage strip contacts each of the second conductive features. In some embodiments, the method further includes: depositing a first conductive strip in the first trench, the first data storage strip disposed between the first conductive strip and each of the first conductive features; and depositing a second conductive strip in the second trench, the second data storage strip disposed between the second conductive strip and each of the second conductive features. In some embodiments of the method, the first data storage strip is a first ferroelectric strip and the second data storage strip is a second ferroelectric strip. In some embodiments of the method, the first data storage strip is a first plurality of dielectric layers and the second data storage strip is a second plurality of dielectric layers. In some embodiments of the method, the first trench is one of a plurality of first trenches etched in the multilayer stack, portions of the multilayer stack between the first trenches having first aspect ratios, each of the first aspect ratios being in a range of 5 to 15. In some embodiments of the method, replacing the first portions of the sacrificial layers with the first conductive features includes: removing the first portions of the sacrificial layers to form first sidewall recesses in the first trench; depositing first glue layers in the first sidewall recesses; and depositing first main layers in the first sidewall recesses, each of the first glue layers extending along three sides of a respective one of the first main layers. In some embodiments of the method, replacing the second portions of the sacrificial layers with the second conductive features includes: removing the second portions of the sacrificial layers to form second sidewall recesses in the second trench; depositing second glue layers in the second sidewall recesses; and depositing second main layers in the second sidewall recesses, each of the second glue layers extending along three sides of a respective one of the second main layers. In some embodiments of the method, the first glue layers and the second glue layers are formed of the same conductive material, and the first glue layers merge with the second glue layers. In some embodiments of the method, the first glue layers and the second glue layers are formed of different conductive materials, and the first glue layers are separate and distinct from the second glue layers.

In an embodiment, a device includes: a first dielectric layer over a substrate; a word line over the first dielectric layer, the word line including a first main layer and a first glue layer, the first glue layer extending along a bottom surface, a top surface, and a first sidewall of the first main layer; a second dielectric layer over the word line; a first bit line extending through the second dielectric layer and the first dielectric layer; and a data storage strip disposed between the first bit line and the word line, the data storage strip extending along a second sidewall of the word line. In some embodiments of the device, the word line further includes a second main layer, the first glue layer extending along a bottom surface, a top surface, and a sidewall of the second main layer. In some embodiments of the device, the word line further includes a second main layer and a second glue layer, the second glue layer extending along a bottom surface, a top surface, and a sidewall of the second main layer, the second glue layer and the first glue layer including different conductive materials. In some embodiments of the device, the first glue layer has a thickness in a range of 1 nm to 10 nm, the first main layer has a thickness in a range of 15 nm to 35 nm, the word line has an overall thickness in a range of 15 nm to 70 nm, and the word line has an overall width in a range of 10 nm to 60 nm. In some embodiments, the device further includes: a dielectric plug extending through the second dielectric layer and the first dielectric layer, the word line disposed between the dielectric plug and the first bit line; and an interconnect structure over the second dielectric layer, the interconnect structure including a bit line interconnect extending over the dielectric plug and the first bit line, the bit line interconnect physically and electrically coupled to the first bit line. In some embodiments, the device further includes: a second bit line extending through the second dielectric layer and the first dielectric layer, the word line disposed between the first bit line and the second bit line; and an interconnect structure over the second dielectric layer, the interconnect structure including: a first bit line interconnect extending over the first bit line and the second bit line; a straight interconnect connecting the first bit line interconnect to the first bit line; a second bit line interconnect laterally offset from the first bit line and the second bit line; and a lateral interconnect connecting the second bit line interconnect to the second bit line.

In an embodiment, a device includes: a first dielectric layer over a substrate; a second dielectric layer over the first dielectric layer; a word line between the first dielectric layer and the second dielectric layer, the word line including a first main layer, a second main layer, and a first glue layer, the first glue layer laterally disposed between the first main layer and the second main layer; a first data storage strip contacting sidewalls of the first main layer, the first dielectric layer, and the second dielectric layer; and a second data storage strip contacting sidewalls of the second main layer, the first dielectric layer, and the second dielectric layer.

In some embodiments of the device, the word line further includes a second glue layer laterally disposed between the first glue layer and the second main layer, the second glue layer and the first glue layer including different conductive materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a first dielectric layer over a substrate;
a word line over the first dielectric layer, the word line comprising a first main layer, a second main layer, and a first glue layer, the first glue layer extending along a bottom surface, a top surface, and a first sidewall of the first main layer, the first glue layer being between the first main layer and the second main layer, wherein the first main layer and the second main layer are the same material;
a second dielectric layer over the word line, wherein the second dielectric layer extends continuously from over the first main layer to over the second main layer;
a first bit line extending through the second dielectric layer and the first dielectric layer; and a data storage strip disposed between the first bit line and the word line, the data storage strip extending along and physically contacting a second sidewall of the first main layer, the second sidewall opposite the first sidewall.

2. The device of claim 1, wherein the first glue layer extends along a bottom surface, a top surface, and a sidewall of the second main layer.

3. The device of claim 1, wherein the word line further comprises a second glue layer, the second glue layer extending along a bottom surface, a top surface, and a sidewall of the second main layer, the second glue layer and the first glue layer comprising different conductive materials.

4. The device of claim 1, wherein the first glue layer has a thickness in a range of 1 nm to 10 nm, the first main layer has a thickness in a range of 15 nm to 35 nm, the word line has an overall thickness in a range of 15 nm to 70 nm, and the word line has an overall width in a range of 10 nm to 60 nm.

5. The device of claim 1 further comprising:
a dielectric plug extending through the second dielectric layer and the first dielectric layer, the word line disposed between the dielectric plug and the first bit line; and
an interconnect structure over the second dielectric layer, the interconnect structure comprising a bit line interconnect extending over the dielectric plug and the first bit line, the bit line interconnect physically and electrically coupled to the first bit line.

6. The device of claim 1 further comprising:
a second bit line extending through the second dielectric layer and the first dielectric layer, the word line disposed between the first bit line and the second bit line; and
an interconnect structure over the second dielectric layer, the interconnect structure comprising:
a first bit line interconnect extending over the first bit line and the second bit line;
a straight interconnect connecting the first bit line interconnect to the first bit line;
a second bit line interconnect laterally offset from the first bit line and the second bit line; and
a lateral interconnect connecting the second bit line interconnect to the second bit line.

7. A device comprising:
a first dielectric layer over a substrate;
a second dielectric layer over the first dielectric layer;
a word line between the first dielectric layer and the second dielectric layer, the word line comprising a first main layer, a second main layer, and a first glue layer, the first glue layer laterally disposed between the first main layer and the second main layer;
a first data storage strip contacting sidewalls of the first main layer, the first dielectric layer, and the second dielectric layer; and
a second data storage strip contacting sidewalls of the second main layer, the first dielectric layer, and the second dielectric layer, wherein the first dielectric layer extends continuously from the first data storage strip to the second data storage strip.

8. The device of claim 7, wherein the word line further comprises a second glue layer laterally disposed between the first glue layer and the second main layer, the second glue layer and the first glue layer comprising different conductive materials.

9. The device of claim 7 further comprising:
a first bit line on the first data storage strip;

a first semiconductor strip between the first bit line and the first data storage strip;
a second bit line on the second data storage strip; and
a second semiconductor strip between the second bit line and the second data storage strip.

10. The device of claim 9, wherein the first bit line is laterally offset from the second bit line.

11. The device of claim 10 further comprising:
a first bit line interconnect above and connected to the first bit line; and
a second bit line interconnect above and connected to the second bit line.

12. The device of claim 9, wherein the first bit line is laterally aligned with the second bit line.

13. The device of claim 12 further comprising:
a straight interconnect above and connected to the first bit line;
a lateral interconnect above and connected to the second bit line;
a first bit line interconnect above and connected to the straight interconnect; and
a second bit line interconnect above and connected to the lateral interconnect.

14. A device comprising:
a word line extending in a first direction, the word line comprising a first conductive feature and a second conductive feature, the first conductive feature comprising a first main layer and a first glue layer, the second conductive feature comprising a second main layer and a second glue layer, wherein the first glue layer contacts the second glue layer;
a first ferroelectric strip on a first sidewall of the first conductive feature;
a first semiconductor strip on a first sidewall of the first ferroelectric strip;
a first bit line on a first sidewall of the first semiconductor strip, the first bit line extending in a second direction, the second direction perpendicular to the first direction;
a first source line on the first sidewall of the first semiconductor strip, the first source line extending in the second direction;
a first dielectric layer on the first sidewall of the first semiconductor strip, the first dielectric layer disposed between the first bit line and the first source line; and
a second ferroelectric strip on a second sidewall of the second conductive feature, wherein the word line extends continuously from the first ferroelectric strip to the second ferroelectric strip.

15. The device of claim 14, wherein the first glue layer extends along a bottom surface, a top surface, and a first sidewall of the first main layer, and the second glue layer extends along a bottom surface, a top surface, and a second sidewall of the second main layer.

16. The device of claim 14, wherein the first glue layer and the second glue layer comprise the same conductive material.

17. The device of claim 14, wherein the first glue layer and the second glue layer comprise different conductive materials.

18. The device of claim 14 further comprising:
a second semiconductor strip on a second sidewall of the second ferroelectric strip;
a second bit line on a second sidewall of the second semiconductor strip, the second bit line extending in the second direction;

a second source line on the second sidewall of the second semiconductor strip, the second source line extending in the second direction; and a second dielectric layer on the second sidewall of the second semiconductor strip, the second dielectric layer disposed between the second bit line and the second source line.

19. The device of claim 18, wherein the first source line is aligned with the second source line along the first direction, and the first bit line is aligned with the second bit line along the first direction.

20. The device of claim 18, wherein the first source line is offset from the second source line along the first direction, and the first bit line is offset from the second bit line along the first direction.

* * * * *